(12) United States Patent
Melanson

(10) Patent No.: US 8,963,535 B1
(45) Date of Patent: Feb. 24, 2015

(54) SWITCH CONTROLLED CURRENT SENSING USING A HALL EFFECT SENSOR

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 1066 days.

(21) Appl. No.: 12/495,142

(22) Filed: Jun. 30, 2009

(51) Int. Cl.
*G01R 15/20* (2006.01)
*G01R 33/07* (2006.01)

(52) U.S. Cl.
USPC ............ 324/117 H; 324/207.2; 324/244; 324/251; 324/252; 307/116

(58) Field of Classification Search
CPC ............ G01R 19/2506; G01R 33/027; G01R 19/0092; G01R 33/077; G05B 19/0421; H03F 3/45995
USPC ............ 324/117 H, 207.2, 244, 251, 252
See application file for complete search history.

(56) References Cited

U.S. PATENT DOCUMENTS

| | | |
|---|---|---|
| 3,316,495 A | 4/1967 | Sherer |
| 3,423,689 A | 1/1969 | Miller et al. |
| 3,586,988 A | 6/1971 | Weekes |
| 3,725,804 A | 4/1973 | Langan |
| 3,790,878 A | 2/1974 | Brokaw |
| 3,881,167 A | 4/1975 | Pelton et al. |
| 4,075,701 A | 2/1978 | Hofmann |
| 4,334,250 A | 6/1982 | Theus |
| 4,409,476 A | 10/1983 | Lofgren et al. |
| 4,414,493 A | 11/1983 | Henrich |
| 4,476,706 A | 10/1984 | Hadden et al. |
| 4,523,128 A | 6/1985 | Stamm |
| 4,677,366 A | 6/1987 | Wilkinson et al. |
| 4,683,529 A | 7/1987 | Bucher |
| 4,700,188 A | 10/1987 | James |

(Continued)

FOREIGN PATENT DOCUMENTS

| | | |
|---|---|---|
| DE | 19713814 | 10/1998 |
| EP | 0585789 A1 | 3/1994 |

(Continued)

OTHER PUBLICATIONS

D. Hausman, Lutron, RTISS-TE Operation, Real-Time Illumination Stability Systems for Trailing-Edge (Reverse Phase Control) Dimmers, v. 1.0 Dec. 2004.

(Continued)

*Primary Examiner* — Tung X Nguyen
*Assistant Examiner* — Giovanni Astacio-Oquendo
(74) *Attorney, Agent, or Firm* — Terrile, Cannatti, Chambers & Holland, LLP; Kent B. Chambers

(57) ABSTRACT

An electronic system includes a Hall sensor to sense a controlled current. The Hall sensor is positioned proximate to a signal path and develops a voltage that includes a component corresponding to a controlled current. A controller generates a switch control signal to control conductivity of a switch, and the switch controls drive current for a load. The controller receives information either directly or indirectly from the Hall sensor corresponding to the controlled current and utilizes the information from the Hall sensor to control conductivity of the switch. Controlling conductivity of the switch controls the drive current for the load. The frequency of the switch control signal is sufficiently higher than a Hall sensor noise voltage to allow the controller to sufficiently cancel out the noise voltage for control purposes.

44 Claims, 14 Drawing Sheets

(56) References Cited

U.S. PATENT DOCUMENTS

| | | | |
|---|---|---|---|
| 4,737,658 A | 4/1988 | Kronmuller et al. | |
| 4,797,633 A | 1/1989 | Humphrey | |
| 4,937,728 A | 6/1990 | Leonardi | |
| 4,940,929 A | 7/1990 | Williams | |
| 4,973,919 A | 11/1990 | Allfather | |
| 4,979,087 A | 12/1990 | Sellwood et al. | |
| 4,980,898 A | 12/1990 | Silvian | |
| 4,992,919 A | 2/1991 | Lee et al. | |
| 4,994,952 A | 2/1991 | Silva et al. | |
| 5,001,620 A | 3/1991 | Smith | |
| 5,055,746 A | 10/1991 | Hu et al. | |
| 5,109,185 A | 4/1992 | Ball | |
| 5,121,079 A | 6/1992 | Dargatz | |
| 5,206,540 A | 4/1993 | de Sa e Silva et al. | |
| 5,264,780 A | 11/1993 | Bruer et al. | |
| 5,278,490 A | 1/1994 | Smedley | |
| 5,323,157 A | 6/1994 | Ledzius et al. | |
| 5,359,180 A | 10/1994 | Park et al. | |
| 5,383,109 A | 1/1995 | Maksimovic et al. | |
| 5,424,932 A | 6/1995 | Inou et al. | |
| 5,477,481 A | 12/1995 | Kerth | |
| 5,479,333 A | 12/1995 | McCambridge et al. | |
| 5,481,178 A | 1/1996 | Wilcox et al. | |
| 5,565,761 A | 10/1996 | Hwang | |
| 5,589,759 A | 12/1996 | Borgato et al. | |
| 5,638,265 A | 6/1997 | Gabor | |
| 5,691,890 A | 11/1997 | Hyde | |
| 5,747,977 A | 5/1998 | Hwang | |
| 5,757,635 A | 5/1998 | Seong | |
| 5,764,039 A | 6/1998 | Choi et al. | |
| 5,768,111 A | 6/1998 | Zaitsu | |
| 5,781,040 A | 7/1998 | Myers | |
| 5,783,909 A | 7/1998 | Hochstein | |
| 5,798,635 A | 8/1998 | Hwang et al. | |
| 5,900,683 A | 5/1999 | Rinehart et al. | |
| 5,912,812 A | 6/1999 | Moriarty, Jr. | |
| 5,929,400 A | 7/1999 | Colby et al. | |
| 5,946,202 A | 8/1999 | Balogh | |
| 5,946,206 A | 8/1999 | Shimizu et al. | |
| 5,952,849 A | 9/1999 | Haigh et al. | |
| 5,960,207 A | 9/1999 | Brown | |
| 5,962,989 A | 10/1999 | Baker | |
| 5,963,086 A | 10/1999 | Hall | |
| 5,966,297 A | 10/1999 | Minegishi | |
| 5,994,885 A | 11/1999 | Wilcox et al. | |
| 6,016,038 A | 1/2000 | Mueller et al. | |
| 6,037,763 A * | 3/2000 | Trontelj | 324/117 H |
| 6,043,633 A | 3/2000 | Lev et al. | |
| 6,072,969 A | 6/2000 | Yokomori et al. | |
| 6,083,276 A | 7/2000 | Davidson et al. | |
| 6,084,450 A | 7/2000 | Smith et al. | |
| 6,091,233 A | 7/2000 | Hwang | |
| 6,125,046 A | 9/2000 | Jang et al. | |
| 6,150,774 A | 11/2000 | Mueller et al. | |
| 6,181,114 B1 | 1/2001 | Hemena et al. | |
| 6,211,626 B1 | 4/2001 | Lys et al. | |
| 6,211,627 B1 | 4/2001 | Callahan | |
| 6,229,271 B1 | 5/2001 | Liu | |
| 6,229,292 B1 | 5/2001 | Redl et al. | |
| 6,246,183 B1 | 6/2001 | Buonavita | |
| 6,259,614 B1 | 7/2001 | Ribarich et al. | |
| 6,300,723 B1 | 10/2001 | Wang et al. | |
| 6,304,066 B1 | 10/2001 | Wilcox et al. | |
| 6,304,473 B1 | 10/2001 | Telefus et al. | |
| 6,343,026 B1 | 1/2002 | Perry | |
| 6,344,811 B1 | 2/2002 | Melanson | |
| 6,369,525 B1 | 4/2002 | Chang et al. | |
| 6,385,063 B1 | 5/2002 | Sadek et al. | |
| 6,392,400 B1 * | 5/2002 | Lancaster et al. | 324/117 H |
| 6,407,514 B1 | 6/2002 | Glaser et al. | |
| 6,407,515 B1 | 6/2002 | Hesler | |
| 6,407,691 B1 | 6/2002 | Yu | |
| 6,441,558 B1 | 8/2002 | Muthu et al. | |
| 6,445,600 B2 * | 9/2002 | Ben-Yaakov | 363/39 |
| 6,452,521 B1 | 9/2002 | Wang | |
| 6,469,484 B2 | 10/2002 | L'Hermite et al. | |
| 6,495,964 B1 | 12/2002 | Muthu et al. | |
| 6,509,913 B2 | 1/2003 | Martin, Jr. et al. | |
| 6,531,854 B2 | 3/2003 | Hwang | |
| 6,580,258 B2 | 6/2003 | Wilcox et al. | |
| 6,583,550 B2 | 6/2003 | Iwasa et al. | |
| 6,628,106 B1 | 9/2003 | Batarseh et al. | |
| 6,636,003 B2 | 10/2003 | Rahm et al. | |
| 6,646,848 B2 | 11/2003 | Yoshida et al. | |
| 6,657,417 B1 | 12/2003 | Hwang | |
| 6,688,753 B2 | 2/2004 | Calon et al. | |
| 6,713,974 B2 | 3/2004 | Patchornik et al. | |
| 6,724,174 B1 | 4/2004 | Esteves et al. | |
| 6,727,832 B1 | 4/2004 | Melanson | |
| 6,737,845 B2 | 5/2004 | Hwang | |
| 6,741,123 B1 | 5/2004 | Anderson et al. | |
| 6,753,661 B2 | 6/2004 | Muthu et al. | |
| 6,756,772 B2 | 6/2004 | McGinnis | |
| 6,768,655 B1 | 7/2004 | Yang et al. | |
| 6,781,351 B2 | 8/2004 | Mednik et al. | |
| 6,788,011 B2 | 9/2004 | Mueller et al. | |
| 6,806,659 B1 | 10/2004 | Mueller et al. | |
| 6,839,247 B1 | 1/2005 | Yang | |
| 6,860,628 B2 | 3/2005 | Robertson et al. | |
| 6,870,325 B2 | 3/2005 | Bushell et al. | |
| 6,873,065 B2 | 3/2005 | Haigh et al. | |
| 6,882,552 B2 | 4/2005 | Telefus et al. | |
| 6,888,322 B2 | 5/2005 | Dowling et al. | |
| 6,894,471 B2 | 5/2005 | Corva et al. | |
| 6,933,706 B2 | 8/2005 | Shih | |
| 6,940,733 B2 | 9/2005 | Schie et al. | |
| 6,944,034 B1 | 9/2005 | Shytenberg et al. | |
| 6,956,750 B1 | 10/2005 | Eason et al. | |
| 6,958,920 B2 | 10/2005 | Mednik et al. | |
| 6,963,496 B2 | 11/2005 | Bimbaud | |
| 6,967,448 B2 | 11/2005 | Morgan et al. | |
| 6,970,503 B1 | 11/2005 | Kalb | |
| 6,975,079 B2 | 12/2005 | Lys et al. | |
| 6,975,523 B2 | 12/2005 | Kim et al. | |
| 6,980,446 B2 | 12/2005 | Simada et al. | |
| 7,003,023 B2 | 2/2006 | Krone et al. | |
| 7,034,611 B2 | 4/2006 | Oswal et al. | |
| 7,050,509 B2 | 5/2006 | Krone et al. | |
| 7,064,498 B2 | 6/2006 | Dowling et al. | |
| 7,064,531 B1 | 6/2006 | Zinn | |
| 7,072,191 B2 | 7/2006 | Nakao et al. | |
| 7,075,329 B2 | 7/2006 | Chen et al. | |
| 7,078,963 B1 | 7/2006 | Andersen et al. | |
| 7,088,059 B2 | 8/2006 | McKinney et al. | |
| 7,099,163 B1 | 8/2006 | Ying | |
| 7,102,902 B1 | 9/2006 | Brown et al. | |
| 7,106,603 B1 | 9/2006 | Lin et al. | |
| 7,109,791 B1 | 9/2006 | Epperson et al. | |
| 7,126,288 B2 | 10/2006 | Ribarich et al. | |
| 7,135,824 B2 | 11/2006 | Lys et al. | |
| 7,145,295 B1 | 12/2006 | Lee et al. | |
| 7,158,633 B1 | 1/2007 | Hein | |
| 7,161,816 B2 | 1/2007 | Shytenberg et al. | |
| 7,180,250 B1 | 2/2007 | Gannon | |
| 7,183,957 B1 | 2/2007 | Melanson | |
| 7,221,130 B2 | 5/2007 | Ribeiro et al. | |
| 7,233,135 B2 | 6/2007 | Noma et al. | |
| 7,246,919 B2 | 7/2007 | Porchia et al. | |
| 7,255,457 B2 | 8/2007 | Ducharm et al. | |
| 7,265,531 B2 * | 9/2007 | Stauth et al. | 324/117 H |
| 7,266,001 B1 | 9/2007 | Notohamiprodjo et al. | |
| 7,276,861 B1 | 10/2007 | Shteynberg et al. | |
| 7,288,902 B1 | 10/2007 | Melanson | |
| 7,292,013 B1 | 11/2007 | Chen et al. | |
| 7,310,244 B2 | 12/2007 | Yang et al. | |
| 7,345,458 B2 | 3/2008 | Kanai et al. | |
| 7,375,476 B2 | 5/2008 | Walter et al. | |
| 7,388,764 B2 | 6/2008 | Huynh et al. | |
| 7,394,210 B2 | 7/2008 | Ashdown | |
| 7,414,389 B2 * | 8/2008 | Nguyen | 324/117 H |
| 7,511,437 B2 | 3/2009 | Lys et al. | |
| 7,538,499 B2 | 5/2009 | Ashdown | |
| 7,545,130 B2 | 6/2009 | Latham | |
| 7,554,473 B2 | 6/2009 | Melanson | |

(56) References Cited

U.S. PATENT DOCUMENTS

| | | | |
|---|---|---|---|
| 7,569,996 B2 | 8/2009 | Holmes et al. | |
| 7,583,136 B2 | 9/2009 | Pelly | |
| 7,656,103 B2 | 2/2010 | Shteynberg et al. | |
| 7,667,986 B2 | 2/2010 | Artusi et al. | |
| 7,710,047 B2 | 5/2010 | Shteynberg et al. | |
| 7,719,246 B2 | 5/2010 | Melanson | |
| 7,719,248 B1 | 5/2010 | Melanson | |
| 7,746,043 B2 | 6/2010 | Melanson | |
| 7,746,671 B2 | 6/2010 | Radecker et al. | |
| 7,750,615 B2* | 7/2010 | Jung et al. | 323/282 |
| 7,750,738 B2 | 7/2010 | Bach | |
| 7,756,896 B1 | 7/2010 | Feingold | |
| 7,777,563 B2 | 8/2010 | Midya et al. | |
| 7,804,256 B2 | 9/2010 | Melanson | |
| 7,804,480 B2 | 9/2010 | Jeon et al. | |
| 7,923,973 B2* | 4/2011 | Odell | 323/207 |
| 8,040,114 B2* | 10/2011 | Saint-Pierre | 323/222 |
| 2002/0065583 A1 | 5/2002 | Okada | |
| 2002/0145041 A1 | 10/2002 | Muthu et al. | |
| 2002/0150151 A1 | 10/2002 | Krone et al. | |
| 2002/0166073 A1 | 11/2002 | Nguyen et al. | |
| 2002/0186010 A1* | 12/2002 | Kliemannel | 324/251 |
| 2003/0095013 A1 | 5/2003 | Melanson et al. | |
| 2003/0174520 A1 | 9/2003 | Bimbaud | |
| 2003/0223255 A1 | 12/2003 | Ben-Yaakov | |
| 2004/0004465 A1 | 1/2004 | McGinnis | |
| 2004/0046683 A1 | 3/2004 | Mitamura et al. | |
| 2004/0085030 A1 | 5/2004 | Laflamme et al. | |
| 2004/0085117 A1 | 5/2004 | Melbert et al. | |
| 2004/0169477 A1 | 9/2004 | Yancie et al. | |
| 2004/0227571 A1 | 11/2004 | Kuribayashi | |
| 2004/0228116 A1 | 11/2004 | Miller et al. | |
| 2004/0232971 A1 | 11/2004 | Kawasaki et al. | |
| 2004/0239262 A1 | 12/2004 | Ido et al. | |
| 2005/0057237 A1 | 3/2005 | Clavel | |
| 2005/0156770 A1 | 7/2005 | Melanson | |
| 2005/0168492 A1 | 8/2005 | Hekstra et al. | |
| 2005/0184895 A1 | 8/2005 | Petersen et al. | |
| 2005/0197952 A1 | 9/2005 | Shea et al. | |
| 2005/0207190 A1 | 9/2005 | Gritter | |
| 2005/0218838 A1 | 10/2005 | Lys | |
| 2005/0222881 A1 | 10/2005 | Booker | |
| 2005/0253533 A1 | 11/2005 | Lys et al. | |
| 2005/0270813 A1 | 12/2005 | Zhang et al. | |
| 2005/0275354 A1 | 12/2005 | Hausman, Jr. et al. | |
| 2005/0275386 A1 | 12/2005 | Jepsen et al. | |
| 2006/0002110 A1 | 1/2006 | Dowling | |
| 2006/0022916 A1 | 2/2006 | Aiello | |
| 2006/0023002 A1 | 2/2006 | Hara et al. | |
| 2006/0116898 A1 | 6/2006 | Peterson | |
| 2006/0125420 A1 | 6/2006 | Boone et al. | |
| 2006/0184414 A1 | 8/2006 | Pappas et al. | |
| 2006/0214603 A1 | 9/2006 | Oh et al. | |
| 2006/0226795 A1 | 10/2006 | Walter et al. | |
| 2006/0238136 A1 | 10/2006 | Johnson, III et al. | |
| 2006/0261754 A1* | 11/2006 | Lee | 315/291 |
| 2006/0285365 A1 | 12/2006 | Huynh et al. | |
| 2007/0024213 A1 | 2/2007 | Shteynberg et al. | |
| 2007/0029946 A1 | 2/2007 | Yu et al. | |
| 2007/0040512 A1 | 2/2007 | Jungwirth et al. | |
| 2007/0053182 A1 | 3/2007 | Robertson | |
| 2007/0055564 A1 | 3/2007 | Fourman | |
| 2007/0096717 A1* | 5/2007 | Ishihara | 324/117 H |
| 2007/0103949 A1 | 5/2007 | Tsuruya | |
| 2007/0124615 A1 | 5/2007 | Orr | |
| 2007/0126656 A1 | 6/2007 | Huang et al. | |
| 2007/0182699 A1 | 8/2007 | Ha et al. | |
| 2007/0285031 A1 | 12/2007 | Shteynberg et al. | |
| 2008/0012502 A1 | 1/2008 | Lys | |
| 2008/0027841 A1 | 1/2008 | Eder | |
| 2008/0043504 A1 | 2/2008 | Ye et al. | |
| 2008/0054815 A1 | 3/2008 | Kotikalapoodi et al. | |
| 2008/0094055 A1* | 4/2008 | Monreal et al. | 324/117 H |
| 2008/0116818 A1 | 5/2008 | Shteynberg et al. | |
| 2008/0130322 A1 | 6/2008 | Artusi et al. | |
| 2008/0130336 A1 | 6/2008 | Taguchi | |
| 2008/0150433 A1 | 6/2008 | Tsuchida et al. | |
| 2008/0154679 A1 | 6/2008 | Wade | |
| 2008/0174291 A1 | 7/2008 | Hansson et al. | |
| 2008/0174372 A1 | 7/2008 | Tucker et al. | |
| 2008/0175029 A1 | 7/2008 | Jung et al. | |
| 2008/0192509 A1 | 8/2008 | Dhuyvetter et al. | |
| 2008/0224635 A1 | 9/2008 | Hayes | |
| 2008/0232141 A1 | 9/2008 | Artusi et al. | |
| 2008/0239764 A1 | 10/2008 | Jacques et al. | |
| 2008/0259655 A1 | 10/2008 | Wei et al. | |
| 2008/0278132 A1 | 11/2008 | Kesterson et al. | |
| 2008/0278891 A1* | 11/2008 | Bidenbach et al. | 361/679 |
| 2009/0067204 A1 | 3/2009 | Ye et al. | |
| 2009/0070188 A1 | 3/2009 | Scott et al. | |
| 2009/0147544 A1 | 6/2009 | Melanson | |
| 2009/0174479 A1 | 7/2009 | Yan et al. | |
| 2009/0218960 A1 | 9/2009 | Lyons et al. | |
| 2010/0072956 A1* | 3/2010 | Fiebrich et al. | 320/162 |
| 2010/0141317 A1 | 6/2010 | Szajnowski | |

FOREIGN PATENT DOCUMENTS

| | | |
|---|---|---|
| EP | 0632679 | 1/1995 |
| EP | 0838791 | 4/1998 |
| EP | 0910168 A1 | 4/1999 |
| EP | 1014563 | 6/2000 |
| EP | 1164819 A | 12/2001 |
| EP | 1213823 A2 | 6/2002 |
| EP | 1460775 | 9/2004 |
| EP | 1528785 A | 5/2005 |
| EP | 2204905 A1 | 7/2010 |
| GB | 2069269 A | 8/1981 |
| JP | WO 2006/022107 A2 | 3/2006 |
| WO | WO9725836 | 7/1997 |
| WO | 01/15316 A1 | 1/2001 |
| WO | 01/97384 A | 12/2001 |
| WO | 02/15386 A2 | 2/2002 |
| WO | WO0227944 | 4/2002 |
| WO | 02/091805 A2 | 11/2002 |
| WO | WO2006013557 | 2/2006 |
| WO | 2006/067521 A | 6/2006 |
| WO | WO2006135584 | 12/2006 |
| WO | 2007/026170 A | 3/2007 |
| WO | 2007/079362 A | 7/2007 |
| WO | WO2008072160 | 6/2008 |
| WO | WO20080152838 | 12/2008 |

OTHER PUBLICATIONS

International Rectifier, Data Sheet No. PD60230 revC, IR1150(S)(PbF), uPFC One Cycle Control PFC IC Feb. 5, 2007.
Texas Instruments, Application Report SLUA308, UCC3817 Current Sense Transformer Evaluation, Feb. 2004.
Texas Instruments, Application Report SPRA902A, Average Current Mode Controlled Power Factor Correctiom Converter using TMS320LF2407A, Jul. 2005.
Unitrode, Design Note DN-39E, Optimizing Performance in UC3854 Power Factor Correction Applications, Nov. 1994.
Fairchild Semiconductor, Application Note 42030, Theory and Application of the ML4821 Average Currrent Mode PFC Controller, Aug. 1997.
Fairchild Semiconductor, Application Note AN4121, Design of Power Factor Correction Circuit Using FAN7527B, Rev.1.0.1, May 30, 2002.
Fairchild Semiconductor, Application Note 6004, 500W Power-Factor-Corrected (PFC) Converter Design with FAN4810, Rev. 1.0.1, Oct. 31, 2003.
Fairchild Semiconductor, FAN4822, ZVA Average Current PFC Controller, Rev. 1.0.1 Aug. 10, 2001.
Fairchild Semiconductor, ML4821, Power Factor Controller, Rev. 1.0.2, Jun. 19, 2001.
Fairchild Semiconductor, ML4812, Power Factor Controller, Rev. 1.0.4, May 31, 2001.
Linear Technology, 100 Watt LED Driver, Linear Technology, 2006.
Fairchild Semiconductor, FAN7544, Simple Ballast Controller, Rev. 1.0.0, 2004.

(56) References Cited

OTHER PUBLICATIONS

Fairchild Semiconductor, FAN7532, Ballast Controller, Rev. 1.0.2, Jun. 2006.
Fairchild Semiconductor, FAN7711, Ballast Control IC, Rev. 1.0.2, Mar. 2007.
Fairchild Semiconductor, KA7541, Simple Ballast Controller, Rev. 1.0.3, 2001.
ST Microelectronics, L6574, CFL/TL Ballast Driver Preheat and Dimming, Sep. 2003.
ST Microelectronics, AN993, Application Note, Electronic Ballast with PFC Using L6574 and L6561, May 2004.
International Search Report and Written Opinion for PCT/US2008/062384 dated Jan. 14, 2008.
S. Dunlap et al., Design of Delta-Sigma Modulated Switching Power Supply, Circuits & Systems, Proceedings of the 1998 IEEE International Symposium, 1998.
Freescale Semiconductor, Inc., Dimmable Light Ballast with Power Factor Correction, Design Reference Manual, DRM067, Rev. 1, Dec. 2005.
J. Zhou et al., Novel Sampling Algorithm for DSP Controlled 2 kW PFC Converter, IEEE Transactions on Power Electronics, vol. 16, No. 2, Mar. 2001.
A. Prodic, Compensator Design and Stability Assessment for Fast Voltage Loops of Power Factor Correction Rectifiers, IEEE Transactions on Power Electronics, vol. 22, No. 5, Sep. 2007.
M. Brkovic et al., "Automatic Current Shaper with Fast Output Regulation and Soft-Switching," S.15.0 Power Converters, Telecommunications Energy Conference, 1993.
Dallas Semiconductor, Maxim, "Charge-Pump and Step-Up DC-DC Converter Solutions for Powering White LEDs in Series or Parallel Connections," Apr. 23, 2002.
Freescale Semiconductor, AN3052, Implementing PFC Average Current Mode Control Using the MC9S12E128, Nov. 2005.
D. Maksimovic et al., "Switching Converters with Wide DC Conversion Range," Institute of Electrical and Electronic Engineer's (IEEE) Transactions on Power Electronics, Jan. 1991.
V. Nguyen et al., "Tracking Control of Buck Converter Using Sliding-Mode with Adaptive Hysteresis," Power Electronics Specialists Conference, 1995. PESC apos; 95 Record., 26th Annual IEEE vol. 2, Issue, Jun. 18-22, 1995 pp. 1086-1093.
S. Zhou et al., "A High Efficiency, Soft Switching DC-DC Converter with Adaptive Current-Ripple Control for Portable Applications," IEEE Transactions on Circuits and Systems—II: Express Briefs, vol. 53, No. 4, Apr. 2006.
K. Leung et al., "Use of State Trajectory Prediction in Hysteresis Control for Achieving Fast Transient Response of the Buck Converter," Circuits and Systems, 2003. ISCAS apos;03. Proceedings of the 2003 International Symposium, vol. 3, Issue, May 25-28, 2003 pp. III-439-III-442 vol. 3.
K. Leung et al., "Dynamic Hysteresis Band Control of the Buck Converter with Fast Transient Response," IEEE Transactions on Circuits and Systems—II: Express Briefs, vol. 52, No. 7, Jul. 2005.
Y. Ohno, Spectral Design Considerations for White LED Color Rendering, Final Manuscript, Optical Engineering, vol. 44, 111302 (2005).
S. Skogstad et al., A Proposed Stability Characterization and Verification Method for High-Order Single-Bit Delta-Sigma Modulators, Norchip Conference, Nov. 2006 http://folk.uio.no/savskogs/pub/A_Proposed_Stability_Characterization.pdf.
J. Turchi, Four Key Steps to Design a Continuous Conduction Mode PFC Stage Using the NCP1653, ON Semiconductor, Publication Order No. AND184/D, Nov. 2004.
Megaman, D or S Dimming ESL, Product News, Mar. 15, 2007.
J. Qian et al., New Charge Pump Power-Factor-Correction Electronic Ballast with a Wide Range of Line Input Voltage, IEEE Transactions on Power Electronics, vol. 14, No. 1, Jan. 1999.
P. Green, A Ballast that can be Dimmed from a Domestic (Phase-Cut) Dimmer, IRPLCFL3 rev. b, International Rectifier, http://www.irf.com/technical-info/refdesigns/cfl-3.pdf, printed Mar. 24, 2007.
J. Qian et al., Charge Pump Power-Factor-Correction Technologies Part II: Ballast Applications, IEEE Transactions on Power Electronics, vol. 15, No. 1, Jan. 2000.
Chromacity Shifts in High-Power White LED Systems due to Different Dimming Methods, Solid-State Lighting, http://www.lrc.rpi.edu/programs/solidstate/completedProjects.asp?ID=76, printed May 3, 2007.
S. Chan et al., Design and Implementation of Dimmable Electronic Ballast Based on Integrated Inductor, IEEE Transactions on Power Electronics, vol. 22, No. 1, Jan. 2007.
M. Madigan et al., Integrated High-Quality Rectifier-Regulators, IEEE Transactions on Industrial Electronics, vol. 46, No. 4, Aug. 1999.
T. Wu et al., Single-Stage Electronic Ballast with Dimming Feature and Unity Power Factor, IEEE Transactions on Power Electronics, vol. 13, No. 3, May 1998.
F. Tao et al., "Single-Stage Power-Factor-Correction Electronic Ballast with a Wide Continuous Dimming Control for Fluorescent Lamps," IEEE Power Electronics Specialists Conference, vol. 2, 2001.
Azoteq, IQS17 Family, IQ Switch®—ProxSense™ Series, Touch Sensor, Load Control and User Interface, IQS17 Datasheet V2.00.doc, Jan. 2007.
C. Dilouie, Introducing the LED Driver, EC&M, Sep. 2004.
S. Lee et al., TRIAC Dimmable Ballast with Power Equalization, IEEE Transactions on Power Electronics, vol. 20, No. 6, Nov. 2005.
L. Gonthier et al., EN55015 Compliant 500W Dimmer with Low-Losses Symmetrical Switches, 2005 European Conference on Power Electronics and Applications, Sep. 2005.
Why Different Dimming Ranges? The Difference Between Measured and Perceived Light, 2000 http://www.lutron.com/ballast/pdf/LutronBallastpg3.pdf.
D. Hausman, Real-Time Illumination Stability Systems for Trailing-Edge (Reverse Phase Control) Dimmers, Technical White Paper, Lutron, version 1.0, Dec. 2004, http://www.lutron.com/technical_info/pdf/RTISS-TE.pdf.
Light Dimmer Circuits, www.epanorama.net/documents/lights/lightdimmer.html, printed Mar. 26, 2007.
Light Emitting Diode, http://en.wikipedia.org/wiki/Light-emitting_diode, printed Mar. 27, 2007.
Color Temperature, www.sizes.com/units/color_temperature.htm, printed Mar. 27, 2007.
S. Lee et al., A Novel Electrode Power Profiler for Dimmable Ballasts Using DC Link Voltage and Switching Frequency Controls, IEEE Transactions on Power Electronics, vol. 19, No. 3, May 2004.
Y. Ji et al., Compatibility Testing of Fluorescent Lamp and Ballast Systems, IEEE Transactions on Industry Applications, vol. 35, No. 6, Nov./Dec. 1999.
National Lighting Product Information Program, Specifier Reports, "Dimming Electronic Ballasts," vol. 7, No. 3, Oct. 1999.
Supertex Inc., Buck-based LED Drivers Using the HV9910B, Application Note AN-H48, Dec. 28, 2007.
D. Rand et al., Issues, Models and Solutions for Triac Modulated Phase Dimming of LED Lamps, Power Electronics Specialists Conference, 2007.
Supertex Inc., HV9931 Unity Power Factor LED Lamp Driver, Application Note AN-H52, Mar. 7, 2007.
Supertex Inc., 56W Off-line LED Driver, 120VAC with PFC, 160V, 350mA Load, Dimmer Switch Compatible, DN-H05, Feb. 2007.
ST Microelectronics, Power Factor Corrector L6561, Jun. 2004.
Fairchild Semiconductor, Application Note 42047 Power Factor Correction (PFC) Basics, Rev. 0.9.0 Aug. 19, 2004.
M. Radecker et al., Application of Single-Transistor Smart-Power IC for Fluorescent Lamp Ballast, Thirty-Fourth Annual Industry Applications Conference IEEE, vol. 1, Oct. 3, 1999-Oct. 7, 1999.
M. Rico-Secades et al., Low Cost Electronic Ballast for a 36-W Fluorescent Lamp Based on a Current-Mode-Controlled Boost Inverter for a 120-V DC Bus Power Distribution, IEEE Transactions on Power Electronics, vol. 21, No. 4, Jul. 2006.
Fairchild Semiconductor, FAN4800, Low Start-up Current PFC/PWM Controller Combos, Nov. 2006.
Fairchild Semiconductor, FAN4810, Power Factor Correction Controller, Sep. 24, 2003.

(56) References Cited

OTHER PUBLICATIONS

Fairchild Semiconductor, FAN4822, ZVS Average Current PFC Controller, Aug. 10, 2001.
Fairchild Semiconductor, FAN7527B, Power Factor Correction Controller, 2003.
Fairchild Semiconductor, ML4821, Power Factor Controller, Jun. 19, 2001.
Freescale Semiconductor, AN1965, Design of Indirect Power Factor Correction Using 56F800/E, Jul. 2005.
International Search Report for PCT/US2008/051072, mailed Jun. 4, 2008.
"HV9931 Unity Power Factor LED Lamp Driver, Initial Release", Supertex Inc., Sunnyvale, CA USA 2005.
AN-H52 Application Note: "HV9931 Unity Power Factor LED Lamp Driver" Mar. 7, 2007, Supertex Inc., Sunnyvale, CA, USA.
Dustin Rand et al: "Issues, Models and Solutions for Triac Modulated Phase Dimming of LED Lamps" Power Electronics Specialists Conferrence, 2007. PESC 2007. IEEE, IEEE, P1, Jun. 1, 2007, pp. 1398-1404.
Spiazzi G et al: "Analysis of a High-Power Factor Electronic Ballast for High Brightness Light Emitting Diodes" Power Electronics Specialists, 2005 IEEE 36th Conference on Jun. 12, 2005, Piscatawa, NJ, USA, IEEE, Jun. 12, 2005, pp. 1494-1499.
International Search Report PCT/US2008/062381 dated Feb. 5, 2008.
International Search Report PCT/US2008/056739 dated Dec. 3, 2008.
Written Opinion of the International Searching Authority PCT/US2008/062381 dated Feb. 5, 2008.
Ben-Yaakov et al, "The Dynamics of a PWM Boost Converter with Resistive Input" IEEE Transactions on Industrial Electronics, IEEE Service Center, Piscataway, NJ, USA, vol. 46, No. 3, Jun. 1, 1999.
International Search Report PCT/US2008/062398 dated Feb. 5, 2008.
Partial International Search Report PCT/US2008/062387 dated Feb. 5, 2008.
Noon, Jim "UC3855A/B High Performance Power Factor Preregulator", Texas Instruments, SLUA146A, May 1996, Revised Apr. 2004.
International Search Report PCT/GB2006/003259 dated Jan. 12, 2007.
Written Opinion of the International Searching Authority PCT/US2008/056739 dated Dec. 3, 2008.
International Search Report PCT/US2008/056606 dated Dec. 3, 2008.
Written Opinion of the International Searching Authority PCT/US2008/056606 dated Dec. 3, 2008.
International Search Report PCT/US2008/056608 dated Dec. 3, 2008.
Written Opinion of the International Searching Authority PCT/US2008/056608 dated Dec. 3, 2008.
International Search Report PCT/GB2005/050228 dated Mar. 14, 2006.
International Search Report PCT/US2008/062387 dated Jan. 10, 2008.
Data Sheet LT3496 Triple Output LED Driver, Linear Technology Corporation, Milpitas, CA 2007.
Linear Technology, News Release,Triple Output LED, LT3496, Linear Technology, Milpitas, CA, May 24, 2007.
Mamano, Bob, "Current Sensing Solutions for Power Supply Designers", Unitrode Seminar Notes SEM1200, 1999.
http://toolbarpdf.com/docs/functions-and-features-of-inverters.html printed on Jan. 20, 2011.
Linear Technology, "Single Switch PWM Controller with Auxiliary Boost Converter," LT1950 Datasheet, Linear Technology, Inc. Milpitas, CA, 2003.
Yu, Zhenyu, 3.3V DSP for Digital Motor Control, Texas Instruments, Application Report SPRA550 dated Jun. 1999.
International Rectifier, Data Sheet No. PD60143-O, Current Sensing Single Channel Driver, El Segundo, CA, dated Sep. 8, 2004.

Balogh, Laszlo, "Design and Application Guide for High Speed MOSFET Gate Drive Circuits" [Online] 2001, Texas Instruments, Inc., SEM-1400, Unitrode Power Supply Design Seminar, Topic II, TI literature No. SLUP133, XP002552367, Retrieved from the Internet: URL:htt//://focus.ti.com/lit/ml/slup169/slup169.pdf the whole document.
ST Datasheet L6562, Transition-Mode PFC Controller, 2005, STMicroelectronics, Geneva, Switzerland.
Maksimovic, Regan Zane and Robert Erickson, Impact of Digital Control in Power Electronics, Proceedings of 2004 International Symposium on Power Semiconductor Devices & Ics, Kitakyushu Apr. 5, 2010, Colorado Power Electronics Center, ECE Department, University of Colorado, Boulder, CO.
Texas Instruments, 8-Pin Continuous Conduction Mode (CCM) PFC Controller, UCC28019A, SLUS828B, Dec. 2008, Revised Apr. 2009.
Allegro, A1442 Low Voltage Full Bridge Brushless DC Motor Driver with Hall Commutation and Soft-Switching, and Reverse Battery, Short Circuit, and Thermal Shutdown Protection, printed Mar. 27, 2009.
Texas Instruments, Interleaving Continuous Conduction Mode PFC Controller, UCC28070, SLUS794C, Nov. 2007, revised Jun. 2009, Texas Instruments, Dallas TX.
Infineon, CCM-PFC Standalone Power Factor Correction (PFC) Controller in Continuous Conduction Mode (CCM), Version 2.1, Feb. 6, 2007.
International Rectifier, IRAC1150-300W Demo Board, User's Guide, Rev 3.0, Aug. 2, 2005.
International Rectifier, Application Note AN-1077,PFC Converter Design with IR1150 One Cycle Control IC, rev. 2.3, Jun. 2005.
International Rectifier, Data Sheet PD60230 revC, Feb. 5, 2007.
Lu et al, International Rectifier, Bridgeless PFC Implementation Using One Cycle Control Technique, 2005.
Linear Technology, LT1248, Power Factor Controller, Apr. 20, 2007.
ON Semiconductor, AND8123/D, Power Factor Correction Stages Operating in Critical Conduction Mode, Sep. 2003.
ON Semiconductor, MC33260, GreenLine Compact Power Factor Controller: Innovative Circuit for Cost Effective Solutions, Sep. 2005.
ON Semiconductor, NCP1605, Enhanced, High Voltage and Efficient Standby Mode, Power Factor Controller, Feb. 2007.
ON Semconductor, NCP1606, Cost Effective Power Factor Controller, Mar. 2007.
ON Semiconductor, NCP1654, Product Review, Power Factor Controller for Compact and Robust, Continuous Conduction Mode Pre-Converters, Mar. 2007.
Philips, Application Note, 90W Resonant SMPS with TEA1610 SwingChip, AN99011, 1999.
NXP, TEA1750, GreenChip III SMPS control IC Product Data Sheet, Apr. 6, 2007.
Renesas, HA16174P/FP, Power Factor Correction Controller IC, Jan. 6, 2006.
Renesas Technology Releases Industry's First Critical-Conduction-Mode Power Factor Correction Control IC Implementing Interleaved Operation, Dec. 18, 2006.
Renesas, Application Note R2A20111 EVB, PFC Control IC R2A20111 Evaluation Board, Feb. 2007.
STMicroelectronics, L6563, Advanced Transition-Mode PFC Controller, Mar. 2007.
Texas Instruments, Application Note SLUA321, Startup Current Transient of the Leading Edge Triggered PFC Controllers, Jul. 2004.
Texas Instruments, Application Report, SLUA309A, Avoiding Audible Noise at Light Loads when using Leading Edge Triggered PFC Converters, Sep. 2004.
Texas Instruments, Application Report SLUA369B, 350-W, Two-Phase Interleaved PFC Pre-Regulator Design Review, Mar. 2007.
Unitrode, High Power-Factor Preregulator, Oct. 1994.
Texas Instruments, Transition Mode PFC Controller, SLUS515D, Jul. 2005.
Unitrode Products From Texas Instruments, Programmable Output Power Factor Preregulator, Dec. 2004.
Unitrode Products From Texas Instruments, High Performance Power Factor Preregulator, Oct. 2005.

(56) References Cited

OTHER PUBLICATIONS

Texas Instruments, UCC3817 BiCMOS Power Factor Preregulator Evaluation Board User's Guide, Nov. 2002.
Unitrode, L. Balogh, Design Note UC3854A/B and UC3855A/B Provide Power Limiting with Sinusoidal Input Current for PFC Front Ends, SLUA196A, Nov. 2001.
A. Silva De Morais et al., A High Power Factor Ballast Using a Single Switch with Both Power Stages Integrated, IEEE Transactions on Power Electronics, vol. 21, No. 2, Mar. 2006.
M. Ponce et al., High-Efficient Integrated Electronic Ballast for Compact Fluorescent Lamps, IEEE Transactions on Power Electronics, vol. 21, No. 2, Mar. 2006.
A. R. Seidel et al., A Practical Comparison Among High-Power-Factor Electronic Ballasts with Similar Ideas, IEEE Transactions on Industry Applications, vol. 41, No. 6, Nov.-Dec. 2005.
F. T. Wakabayashi et al, An Improved Design Procedure for LCC Resonant Filter of Dimmable Electronic Ballasts for Fluorescent Lamps, Based on Lamp Model, IEEE Transactions on Power Electronics, vol. 20, No. 2, Sep. 2005.
J. A. Vilela Jr. et al, An Electronic Ballast with High Power Factor and Low Voltage Stress, IEEE Transactions on Industry Applications, vol. 41, No. 4, Jul./Aug. 2005.
S. T.S. Lee et al., Use of Saturable Inductor to Improve the Dimming Characteristics of Frequency-Controlled Dimmable Electronic Ballasts, IEEE Transactions on Power Electronics, vol. 19, No. 6, Nov. 2004.
M. K. Kazimierczuk et al., Electronic Ballast for Fluorescent Lamps, IEEE Transactions on Power Electronics, vol. 8, No. 4, Oct. 1993.
S. Ben-Yaakov et al., Statics and Dynamics of Fluorescent Lamps Operating at High Frequency: Modeling and Simulation, IEEE Transactions on Industry Applications, vol. 38, No. 6, Nov.-Dec. 2002.
H. L. Cheng et al., A Novel Single-Stage High-Power-Factor Electronic Ballast with Symmetrical Topology, IEEE Transactions on Power Electronics, vol. 50, No. 4, Aug. 2003.
J.W.F. Dorleijn et al., Standardisation of the Static Resistances of Fluorescent Lamp Cathodes and New Data for Preheating, Industry Applications Conference, vol. 1, Oct. 13, 2002-Oct. 18, 2002.
Q. Li et al., An Analysis of the ZVS Two-Inductor Boost Converter under Variable Frequency Operation, IEEE Transactions on Power Electronics, vol. 22, No. 1, Jan. 2007.
H. Peng et al, Modeling of Quantization Effects in Digitally Controlled DC-DC Converters, IEEE Transactions on Power Electronics, vol. 22, No. 1, Jan. 2007.
G. Yao et al., Soft Switching Circuit for Interleaved Boost Converters, IEEE Transactions on Power Electronics, vol. 22, No. 1, Jan. 2007.
C. M. De Oliviera Stein et al., A ZCT Auxiliary Communication Circuit for Interleaved Boost Converters Operating in Critical Conduction Mode, IEEE Transactions on Power Electronics, vol. 17, No. 6, Nov. 2002.
W. Zhang et al., A New Duty Cycle Control Strategy for Power Factor Correction and FPGA Implementation, IEEE Transactions on Power Electronics, vol. 21, No. 6, Nov. 2006.
H. Wu et al., Single Phase Three-Level Power Factor Correction Circuit with Passive Lossless Snubber, IEEE Transactions on Power Electronics, vol. 17, No. 2, Mar. 2006.
O. Garcia et al., High Efficiency PFC Converter to Meet EN61000-3-2 and A14, Proceedings of the 2002 IEEE International Symposium on Industrial Electronics, vol. 3, 2002.
P. Lee et al., Steady-State Analysis of an Interleaved Boost Converter with Coupled Inductors, IEEE Transactions on Industrial Electronics, vol. 47, No. 4, Aug. 2000.
D.K.W. Cheng et al., A New Improved Boost Converter with Ripple Free Input Current Using Coupled Inductors, Power Electronics and Variable Speed Drives, Sep. 21-23, 1998.
B.A. Miwa et al., High Efficiency Power Factor Correction Using Interleaved Techniques, Applied Power Electronics Conference and Exposition, Seventh Annual Conference Proceedings, Feb. 23-27, 1992.
Z. Lai et al., A Family of Power-Factor-Correction Controllers, Twelfth Annual Applied Power Electronics Conference and Exposition, vol. 1, Feb. 23, 1997-Feb. 27, 1997.
L. Balogh et al., Power-Factor Correction with Interleaved Boost Converters in Continuous-Inductor-Current Mode, Eighth Annual Applied Power Electronics Conference and Exposition, 1993. APEC '93. Conference Proceedings, Mar. 7, 1993-Mar. 11, 1993.
Fairchild Semiconductor, Application Note 42030, Theory and Application of the ML4821 Average Current Mode PFC Controller, Oct. 25, 2000.
Unitrode Products From Texas Instruments, BiCMOS Power Factor Preregulator, Feb. 2006.
Power Integrations, Inc., "TOP200-4/14 TOPSwitch Family Three-terminal Off-line PWM Switch", XP-002524650, Jul. 1996, Sunnyvale, California.
Texas Instruments, SLOS318F, "High-Speed, Low Noise, Fully-Differential I/O Amplifiers," THS4130 and THS4131, US, Jan. 2006.
International Search Report and Written Opinion, PCT US20080062387, dated Feb. 5, 2008.
International Search Report and Written Opinion, PCT US200900032358, dated Jan. 29, 2009.
Hirota, Atsushi et al, "Analysis of Single Switch Delta-Sigma Modulated Pulse Space Modulation PFC Converter Effectively Using Switching Power Device," IEEE, US, 2002.
Prodic, Aleksandar, "Digital Controller for High-Frequency Rectifiers with Power Factor Correction Suitable for On-Chip Implementation," IEEE, US, 2007.
International Search Report and Written Opinion, PCT US20080062378, dated Feb. 5, 2008.
International Search Report and Written Opinion, PCT US20090032351, dated Jan. 29, 2009.
Erickson, Robert W. et al, "Fundamentals of Power Electronics," Second Edition, Chapter 6, Boulder, CO, 2001.
Prodic, A. et al, "Dead Zone Digital Controller for Improved Dynamic Response of Power Factor Preregulators," IEEE, 2003.
International Search Report and Written Report PCT US20080062428 dated Feb. 5, 2008.
Analog Devices, "120 kHz Bandwidth, Low Distortion, Isolation Amplifier", AD215, Norwood, MA, 1996.
Burr-Brown, ISO120 and ISO121, "Precision Los Cost Isolation Amplifier," Tucson AZ, Mar. 1992.
Burr-Brown, ISO130, "High IMR, Low Cost Isolation Amplifier," SBOS220, US, Oct. 2001.

\* cited by examiner

SWITCH CONTROLLED CURRENT SENSING USING A HALL EFFECT SENSOR

BACKGROUND OF THE INVENTION

1. Field of the Invention

The present invention relates in general to the field of electronics, and more specifically to a system and method for sensing switch controlled currents using a Hall effect sensor.

2. Description of the Related Art

Electronic systems often detect signal values and utilize the values to perform other operations. Hall effect sensors ("Hall sensors") are used in some contexts to detect signals. A Hall sensor generates a voltage corresponding to a magnetic field passing through the Hall sensor. An electrical current flowing through a conductor in proximity to a Hall sensor generates a magnetic field. The Hall sensor generates a voltage corresponding to the magnetic field generated by the current. Hall sensors generally have a low frequency noise component that is too large to allow detection of small changes in currents. For example, as explained subsequently in more detail, switching power converters that operate in continuous conduction mode (CCM) sense currents using a current sense circuit such as a resistor or a transformer.

FIG. 1A represents a power control system 100, which includes switching power converter 102. In at least one embodiment, switching power converter operates in a continuous conduction mode (CCM). In CCM, the inductor current $i_L$ does not go to zero during operation of switching power converter 102. As subsequently described in more detail, in CCM operation, PFC and output voltage controller 114 senses controlled current $i_{CC}$ by sensing a voltage across resistor 109. Voltage source 101 supplies an alternating current (AC) input voltage $V_{IN}$ to a full bridge diode rectifier 103. The voltage source 101 is, for example, a public utility, and the AC voltage $V_{IN}$ is, for example, a 60 Hz/110 V line voltage in the United States of America or a 50 Hz/220 V line voltage in Europe. The rectifier 103 rectifies the input voltage $V_{IN}$ and supplies a rectified, time-varying, line input voltage $V_X$ to the switching power converter.

The switching power converter 102 includes at least two switching operations, i.e. controlling field effect transistor (FET) 108 to provide power factor correction and controlling FET 108 to provide regulation of link voltage $V_{LINK}$. The goal of power factor correction technology is to make the switching power converter 102 appear resistive to the voltage source 101 so that the real power provided to switching power converter 102 is equal to the apparent power provided to switching power converter 102. The inductor current $i_L$ ramps 'up' when FET 108 conducts, i.e. is "ON". The inductor current $i_L$ ramps down when FET 108 is nonconductive, i.e. is "OFF", and supplies current $i_L$ to recharge capacitor 106. The time period during which inductor current $i_L$ ramps down is commonly referred to as the "inductor flyback time". Diode 111 prevents reverse current flow into inductor 110. In at least one embodiment, control signal $CS_0$ is a pulse width modulated signal, and FET 108 is an n-channel FET. In this embodiment, control signal $CS_0$ is a gate voltage of FET 108, and FET 108 conducts when the pulse width of $CS_0$ is high. Thus, the 'on-time' of FET 108 is determined by the pulse width of control signal $CS_0$. In at least one embodiment, the switching power converter 102 operates in CCM, i.e. ramp up time of the inductor current $i_L$ plus the inductor flyback time is greater than or equal to the period of the control signal $CS_0$.

In at least one embodiment, switching power converter 102 boosts a 110-120 V rectified input voltage $V_X$ to a higher link voltage $V_{LINK}$, such as 200-400V. Accordingly, FET 108 is fabricated to have a breakdown voltage sufficient to accommodate the controlled current $i_{CCT}$ and voltage drops across FET 108 associated with the high input voltage $V_X$ and higher link voltage $V_{LINK}$. FET 108 is a high breakdown voltage device fabricated using a "high" voltage process. In at least one embodiment, FET 108 has a breakdown voltage greater than or equal to 30V and at least sufficient to accommodate operating characteristics of switching power converter 102. In at least one embodiment, power factor correction (PFC) and output voltage controller 114 is an integrated circuit and is fabricated using a low voltage process that is insufficient to fabricate a switch with a sufficiently high breakdown voltage to control the controlled current $i_{CCT}$. Thus, FET 108 is located external to PFC and output voltage controller 114. As subsequently described in more detail, PFC and output voltage controller 114 generates a pulse width modulated control signal $CS_0$ to control conductivity of FET 108. In at least one embodiment, FET 108 is a FET, and control signal $CS_0$ is a gate voltage.

Switching power converter 102 includes current sense resistor 109. The switch controlled current $i_{CC}$ generates a sense voltage $V_{SEN}$ across current sense resistor 109. The PFC and output voltage controller 114 receives the sense voltage $V_{SEN}$. The resistance R of sense resistor 109 is known. The sense voltage $V_{SEN}$ is directly related to switch controlled current $i_{CC}$ via Ohm's law, i.e. $V_{SEN}=i_{CC}\cdot R$. "R" represents a resistance value of sense resistor 109, and the value of R is a matter of design choice. In at least one embodiment, PFC and output voltage controller 114 utilizes the sense voltage $V_{SEN}$ and sensing two signals, namely, the line input voltage $V_X$ and the capacitor voltage/output voltage $V_{LINK}$ to generate the pulse width and duty cycle of control signal $CS_0$.

Capacitor 106 supplies stored energy to load 112. The capacitor 106 is sufficiently large so as to maintain a substantially constant output voltage $V_{LINK}$, as established by PFC and output voltage controller 114 (as discussed in more detail below). The output voltage $V_{LINK}$ remains substantially constant during constant load conditions. However, as load conditions change, the output voltage $V_{LINK}$ changes. The switch state controller 114 responds to the changes in $V_{LINK}$ and adjusts the control signal $CS_0$ to restore a substantially constant output voltage as quickly as possible. The PFC and output voltage controller 114 includes a small capacitor 115 to filter any high frequency signals from the line input voltage $V_X$.

The switch state controller 114 of power control system 100 controls FET 108 and, thus, controls power factor correction (PFC) and regulates output power of the switching power converter 102. As previously stated, the goal of power factor correction technology is to make the switching power converter 102 appear resistive to the voltage source 101. Thus, the switch state controller 114 attempts to control the inductor current $i_L$ so that the average inductor current $i_L$ is linearly and directly related to the line input voltage $V_X$. A CCM PFC controller, model number UCC28019A, available from Texas Instruments, Inc., Texas, USA is an example of switch state controller 114. The switch state controller 114 controls the pulse width (PW) and period (TT) of control signal $CS_0$. To regulate the amount of energy transferred and maintain a power factor close to one, switch state controller 114 varies the period of control signal $CS_0$ so that the input current $i_L$ tracks the changes in input voltage $V_X$ and holds the output voltage $V_{LINK}$ constant. Thus, as the input voltage $V_X$ increases, switch state controller 114 increases the period TT of control signal $CS_0$, and as the input voltage $V_X$ decreases, switch state controller 114 decreases the period of control signal $CS_0$. At the same time, the pulse width PW of control signal $CS_0$ is adjusted to maintain a constant duty cycle (D) of control signal $CS_0$, and, thus, hold the output voltage $V_{LINK}$ constant.

In at least one embodiment, the switch state controller 114 updates the control signal $CS_0$ at a frequency much greater than the frequency of input voltage $V_X$. The frequency of input voltage $V_X$ is generally 50-60 Hz. The frequency 1/TT of control signal $CS_0$ is, for example, between 20 kHz and 130 kHz. Frequencies at or above 20 kHz avoid audio frequencies and frequencies at or below 130 kHz avoid significant switching inefficiencies while still maintaining good power factor, e.g. between 0.9 and 1, and an approximately constant output voltage $V_{LINK}$.

Light emitting diodes (LEDs) are becoming particularly attractive as main stream light sources in part because of energy savings through high efficiency light output and environmental incentives such as the reduction of mercury. LEDs are semiconductor devices and are driven by direct current. The brightness (i.e. luminous intensity) of the LED approximately varies in direct proportion to the current flowing through the LED. Thus, increasing current supplied to an LED increases the brightness of the LED and decreasing current supplied to the LED dims the LED. Current can be modified by either directly reducing the direct current level to the LEDs or by reducing the average current through the LEDs through duty cycle modulation.

FIG. 1B depicts an LED driver system 150. The LED driver system 150 includes a CCM, buck-based switching power converter 152 to provide a load voltage to switching LED system 154. Voltage source 151 supplies the AC supply voltage $V_{IN}$ to a full, diode bridge rectifier 153. The hold-up capacitor C1 holds an approximately direct current (DC) link voltage $V_{LINK}$ across capacitor C1 relative to a reference voltage $V_R$. Link voltage $V_{LINK}$ is also the output voltage of power converter 152 and the input voltage for controller 156. Input filter capacitor C2 provides a high pass filter for high frequency components of the output voltage of rectifier 153. A thermistor NTC1 provides in-rush current protection for power converter 152.

The controller 156 is, for example, a Supertex HV9915B integrated circuit controller available from Supertex, Inc. of Sunnyvale, Calif. The link voltage $V_{LINK}$ can vary from, for example, 8V to 450V. The controller 156 provides a gate drive signal from the GATE output node to the n-channel metal oxide semiconductor field effect transistor (MOSFET) Q1. Controller 156 modulates the gate drive signal, and thus, the conductivity of MOSFET Q1 to provide a constant current to LED system 154. Controller 156 modifies the average resistance of MOSFET Q1 by varying a duty cycle of a pulse width modulated gate drive signal $V_{GATE}$. Resistor $R_1$ and capacitor $C_3$ provide external connections for controller 156 to the ground reference.

Controller 156 generates and uses feedback to maintain a constant current $i_{LED}$ for LEDs 158. Controller 156 receives a current feedback signal $V_{fb}$ representing a feedback voltage $V_{fb}$ sensed across sense resistor $R_2$. The feedback voltage $V_{fb}$ is directly proportional to the LED current $i_{LED}$ in LEDs 158. If the feedback voltage $V_{fb}$ exceeds a predetermined reference corresponding to a desired LED current, the controller 156 responds to the feedback voltage $V_{fb}$ by decreasing the duty cycle of gate drive signal $V_{GATE}$ to increase the average resistance of MOSFET Q1 over time. If the feedback voltage $V_{fb}$ is less than a predetermined reference corresponding to the desired LED current, the controller 156 responds to the feedback voltage $V_{fb}$ by increasing the duty cycle of gate drive signal $V_{GATE}$ to decrease the average resistance of MOSFET Q1 over time.

The LED system 154 includes a chain of one or more, serially connected LEDs 158. When the MOSFET Q1 is "on", i.e. conductive, diode D1 is reversed bias and, current $i_{LED}$ flows through the LEDs 158 and charges inductor $L_1$. When the MOSFET Q1 is "off", i.e. nonconductive, the voltage across inductor $L_1$ changes polarity, and diode $D_1$ creates a current path for the LED current $i_{LED}$. The inductor $L_1$ is chosen so as to store enough energy to maintain a constant current $i_{LED}$ when MOSFET Q1 is "off".

Sensing the controlled current through current sense circuit 109 (FIG. 1A) and the controlled LED current $i_{LED}$ through resistor $R_2$ (FIG. 1B) results in power loss and can be inaccurate.

SUMMARY OF THE INVENTION

In one embodiment of the present invention, an apparatus includes an integrated circuit. The integrated circuit includes a Hall sensor configured to sense a magnetic field of a controlled current. The integrated circuit also includes a controller coupled to the Hall sensor, wherein the controller is configured to receive information from the Hall sensor and to use the information to determine a time to cause a switch, which controls the controlled current, to conduct.

In another embodiment of the present invention, a method includes sensing a magnetic field of a controlled current using a Hall sensor and receiving information from the Hall sensor. The method further includes utilizing the information to determine a time to cause a switch, which controls the controlled current, to conduct.

In a further embodiment of the present invention, an apparatus includes means for sensing a magnetic field of a controlled current using a Hall sensor. The apparatus also includes means for receiving information from the Hall sensor, and means for utilizing the information to determine a time to cause a switch, which controls the controlled current, to conduct.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1A:
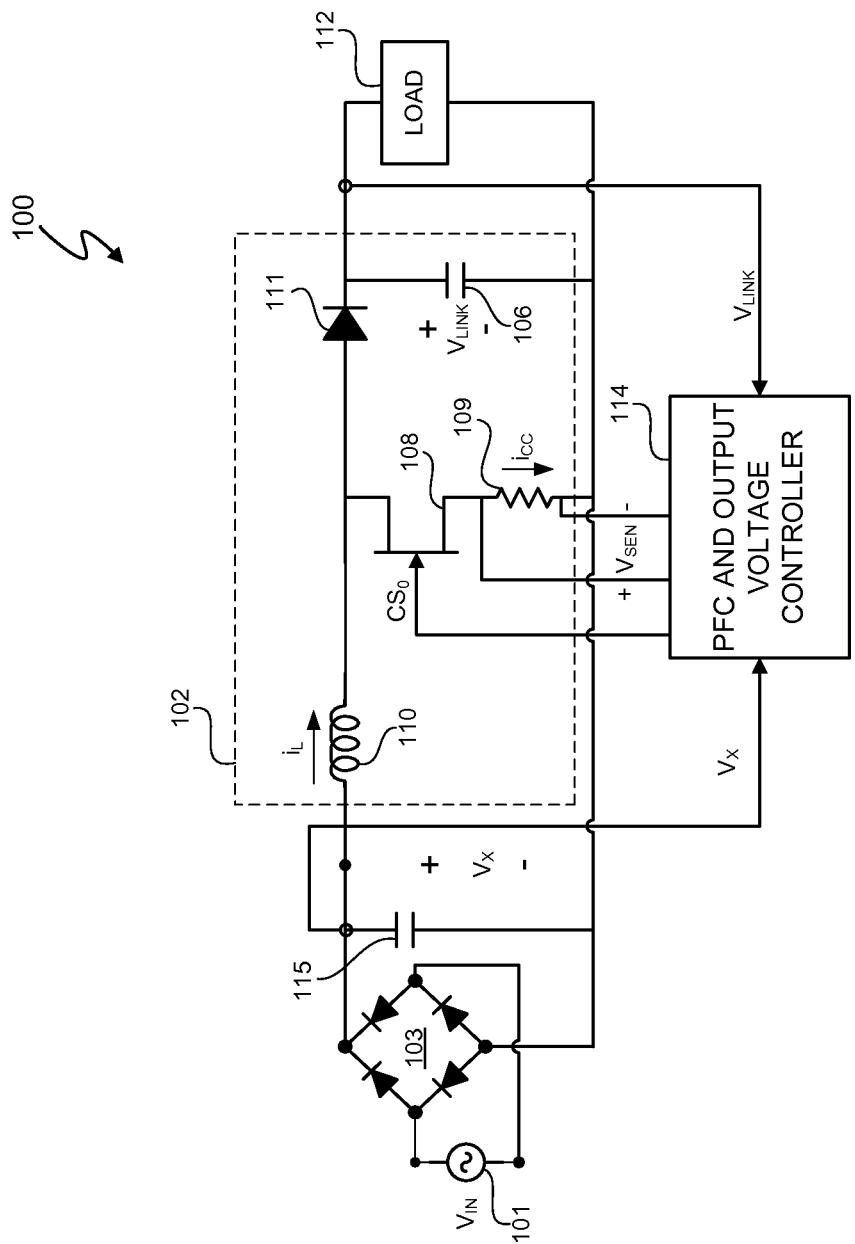
FIG. 1A (labeled prior art) depicts an electronic system having a controller to control a switching power converter.

An electronic system includes a Hall sensor to sense a magnetic field of a controlled current. An average value of the current is controlled by controlling a switch. In at least one embodiment, a controller generates a duty cycle modulated switch control signal to control the switch. Increasing the duty cycle of the switch control signal increases the average value of the controlled current, and decreasing the duty cycle decreases the average value of the controlled current. The controller utilizes information from the Hall sensor about the magnetic field of the controlled current as feedback to control the controlled current. For example, if the information from the Hall sensor indicates the controlled current is too high relative to a target value, the controller decreases the duty cycle of the switch control signal. If the information from the Hall sensor indicates the controlled current is too low relative to the target value, the controller increases the duty cycle of the switch control signal.

In general, conventionally, low frequency noise of a Hall sensor prevents the Hall sensor from accurately sensing voltages related to small changes in current. In a switching power converter, in at least one embodiment, an average current in the switching power converter is controlled within +/−a few milliamps. Thus, conventionally, Hall sensors are not used in such applications because of the relatively large noise component of the Hall sensor. In at least one embodiment, a switching frequency $f_{iCCT}$ of the switch in the switching power converter corresponds to a frequency of pulses of the controlled current. The switching frequency $f_{iCCT}$ of the switch and, thus, the frequency of the controlled current is high relative to a frequency $f_N$ of the noise of the Hall sensor. For example, in at least one embodiment, $f_{iCCT}$ is at least 100 times larger than the noise frequency, i.e. $f_{iCCT} \geq 100 \cdot f_N$. Because $f_{iCCT} \gg f_N$, the Hall noise voltage is effectively constant during a single cycle of the controlled current. The controller can determine a difference between information from the Hall sensor that does not include a component associated with the controlled current to information that includes a component associated with the controlled current and effectively cancel out the Hall sensor noise since the Hall noise voltage is effectively constant during a pulse of the controlled current. For example, if while the Hall noise voltage is effectively constant, the information that does not include a component associated with the controlled current is a baseline voltage $V_{HB}$ and the information that includes the component associated with the controlled current is $V_{HB} + V_{ICCT}$, then the controller can determine $V_{iCCT}$ by subtraction, i.e. $V_{iCCT} = V_{HB} - (V_{HB} + V_{iCCT})$. "$V_{iCCT}$" corresponds to a value of the controlled current. The controller can, thus, effectively cancel out the noise from the Hall sensor. The controller can then utilize the determined value $V_{iCCT}$ of the controlled current as feedback to generate the switch control signal to control the controlled current.

In at least one embodiment, the Hall sensor is positioned proximate to a signal path that conducts the controlled current and develops a voltage that includes a voltage component corresponding to the controlled current. A controller controls conductivity of a switch, and the switch controls the controlled current. Controlling conductivity of the switch controls the controlled current. The controller receives information either directly or indirectly from the Hall sensor corresponding to the controlled current and utilizes the information from the Hall sensor to control conductivity of the switch. In at least one embodiment, the controller generates a duty cycle modulated control signal to control the switch. In at least one embodiment, a pulse of the control signal causes the switch to turn "on", i.e. conduct. In at least one embodiment, the switch can control the current for any purpose, including but not limited to providing power factor correction in a switching power converter and/or driving a load. The load can be any type of load including but not limited to, for example, a light emitting diode (LED) based light source.

In at least one embodiment, the electronic system includes a switching power converter operating in continuous conduction mode (CCM). The Hall sensor senses a magnetic field generated by a controlled current in the switch of the switching power converter and generates a sense signal corresponding to the controlled current. The controller utilizes the sense signal to provide, for example, power factor correction for the CCM switching power converter. In at least one embodiment, the switching power converter operates in discontinuous conduction mode (DCM), and the controller utilizes the sense signal to provide, for example, power factor correction for the DCM switching power converter.

In at least one embodiment, the electronic system includes a light source having one or more light emitting diodes (LEDs). The Hall sensor senses a magnetic field generated by a controlled current in the LEDs and generates a sense signal corresponding to the controlled current. The controller utilizes the sense signal to regulate current in the LEDs.

In at least one embodiment, the Hall sensor and the controller are at least part of an integrated circuit that is connected to a printed circuit board. The printed circuit board includes a signal path, referred to as a "signal trace", that conducts the controlled current. In at least one embodiment, the Hall sensor is positioned proximate to the signal trace and develops a voltage that includes a voltage component corresponding to the controlled current.

In at least one embodiment, utilizing the Hall sensor to detect the controlled current $i_{CCT}$ is more accurate than using a sense resistor (such as sense resistor 109 (FIG. 1)) and dissipates less power than using the sense resistor.

Figure 2A:
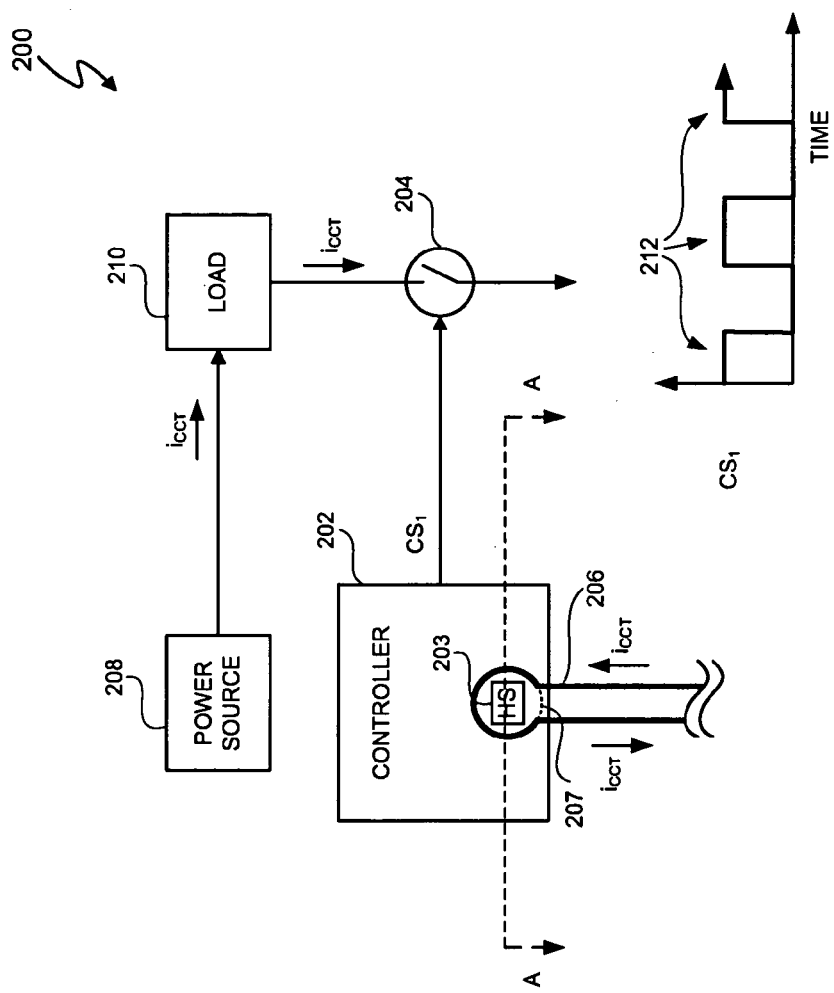
FIGS. 2A, 2B, 2C, and 2D each depict an electronic system that includes a Hall sensor in a controller to sense a magnetic field generated by a current controlled by the controller.

FIG. 2A depicts an electronic system 200 that includes a controller 202, and controller 202 generates a switch control signal $CS_1$ to control conductivity of switch 204. As subsequently described in more detail, controller 202 includes a Hall sensor (HS) 203 to sense controlled current $i_{CCT}$ from load 210. The controlled current $i_{CCT}$ into the switch 204 is routed via signal path 206 within close enough proximity to Hall sensor 203 to allow Hall sensor 203 to develop a voltage corresponding to a magnetic field generated by the controlled current $i_{CCT}$. In at least one embodiment, the signal path 206 is actually connected to switch 204. Signal path 206 is shown as broken without showing the actual connection to switch 204 or load 210 because the particular connection points is a matter of design choice. For example, signal path 206 could connect after switch 204, before switch 204, before load 210, and so on. In at least one embodiment, the signal path 206 receives a mirrored copy of controlled current $i_{CCT}$. The connection and routing of signal path 206 to conduct the controlled current $i_{CCT}$ are matters of design choice. Exemplary connection embodiments are subsequently described. Additionally, the number of turns around Hall sensor 203 is a matter of design choice. The solid line turn of signal path 206 indicates a single turn. The dashed line 207 indicates two or more turns of signal path 206. As subsequently described in more detail, Hall sensor 203 develops a voltage corresponding to the controlled current $i_{CCT}$. Controller 202 utilizes the voltage developed by Hall sensor 203 corresponding to the controlled current $i_{CCT}$ as feedback to generate a switch control signal to control the controlled current $i_{CCT}$.

Electronic system 200 also includes a power source 208 to supply the controlled current $i_{CCT}$ to load 210. Power source 208 can be any source of power, such as voltage source 101 or any power supply that supplies enough power for operation of load 210. Load 210 can be any type of load that utilizes or supplies a switch controlled current $i_{CCT}$. In at least one embodiment, load 210 includes one or more light emitting diodes (LEDs).

Controller 202 generates switch control signal $CS_1$ to control conductivity of current control switch 204 using, for example, duty cycle modulation. Switch 204 can be any type of switch that can be controlled by a switch control signal. In at least one embodiment, switch 204 is a field effect transistor (FET), and switch control signal $CS_1$ is a duty cycle modulated signal. In at least one embodiment, each pulse 212 of control signal $CS_1$ causes switch 204 to conduct. When each pulse ends, switch 204 is nonconductive. Turning switch 204 "on" and "off" in accordance with the duty cycle of switch control signal $CS_1$ establishes an average resistance of switch 204. Since an average value of controlled current $i_{CCT}$ is directly related to the average resistance of switch 204, the duty cycle of control signal $CS_1$ controls an average value of controlled current $i_{CCT}$.

The Hall sensor 203 generates a voltage corresponding to a magnetic field of controlled current $i_{CCT}$. Hall sensor 203 also produces a noise voltage component that can represent a significant component of the voltage generated by Hall sensor 203. In at least one embodiment, the noise voltage of Hall sensor 203 has a relatively low frequency $f_N$ relative to a frequency $f_{iCCT}$ of switch control signal $CS_1$. In at least one embodiment, the frequency $f_{iCCT}$ of switch control signal $CS_1$ is also the frequency of controlled current $i_{CCT}$. As illustratively described in more detail below, in at least one embodiment, because $f_{iCCT} \gg f_N$, controller 202 can sense a baseline noise voltage $V_{HB}$ of Hall sensor 203 (or obtain a representation of the baseline voltage $V_{HB}$, such as an amplified baseline voltage $V_{HB}$) prior to sensing a signal voltage corresponding to the magnetic field of controlled current $i_{CCT}$. In at least one embodiment, the frequency $f_{iCCT}$ is 100-1,000 times greater than the noise frequency $f_N$. The frequency $f_{iCCT}$ of switch control signal $CS_1$ is a matter of design choice. In at least one embodiment, since the baseline noise voltage $V_{HB}$ remains effectively constant during a pulse of the higher frequency controlled current, controller 202 subsequently determines the voltage $V_{ICCT}$ corresponding to the magnetic field of the controlled current $i_{CCT}$ by subtracting the baseline noise $V_{HB}$ voltage of Hall sensor 203 from a Hall sensor output voltage $V_H$ representing $V_{ICCT}$ and $V_{HB}$. Thus, controller 202 effectively cancels out the baseline noise voltage $V_{HB}$ of Hall sensor 203. Since the controlled current $i_{CCT}$ corresponds to the voltage $V_{ICCT}$ corresponding to the magnetic field of the controlled current $i_{CCT}$, controller 202 can determine a value of the controlled current $i_{CCT}$. The dashed A-A line is a cross-section reference for controller 202 discussed subsequently with reference to FIG. 6A.

Figure 2B:
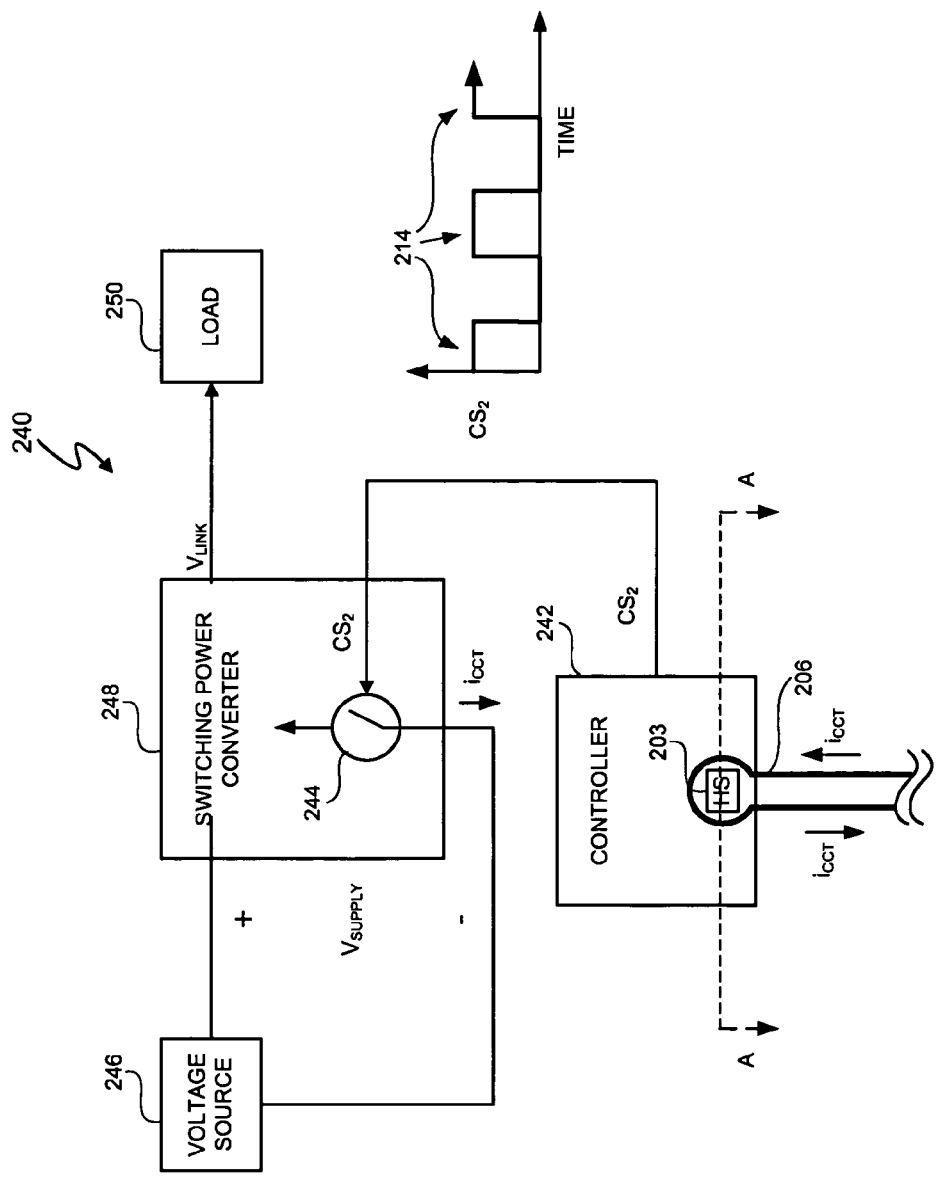

FIG. 2B depicts an electronic system 240 that includes a controller 242 to control power factor correction of a switching power converter 248. As subsequently described in more detail, controller 242 includes a Hall sensor 203 to sense controlled current $i_{CCT}$ through switch 244. The controlled current $i_{CCT}$ is routed via signal path 206. Again, the particular connection points of signal path 206 to conduct controlled current $i_{CCT}$ in the switching power converter 248 or a representation of controlled current $i_{CCT}$ are not shown because they are a matter of design choice. As previously described, controller 242 utilizes the voltage developed by Hall sensor 203 corresponding to the controlled current $i_{CCT}$ to control controlled current $i_{CCT}$.

Controller 242 generates control signal $CS_2$ to control conductivity of current control switch 244. Switch 244 can be any type of switch that can be controlled by a switch control signal. In at least one embodiment, switch 244 is a field effect transistor (FET), and switch control signal $CS_2$ is a duty cycle modulated signal. In at least one embodiment, each pulse 214 of control signal $CS_2$ causes switch 244 to conduct. When each pulse ends, switch 244 is nonconductive. Thus, the duty cycle of control signal $CS_2$ controls an average value of controlled current $i_{CCT}$ through switch 244. The particular methodology for generating control signal $CS_2$ using feedback from Hall sensor 203 is a matter of design choice.

Figure 1B:
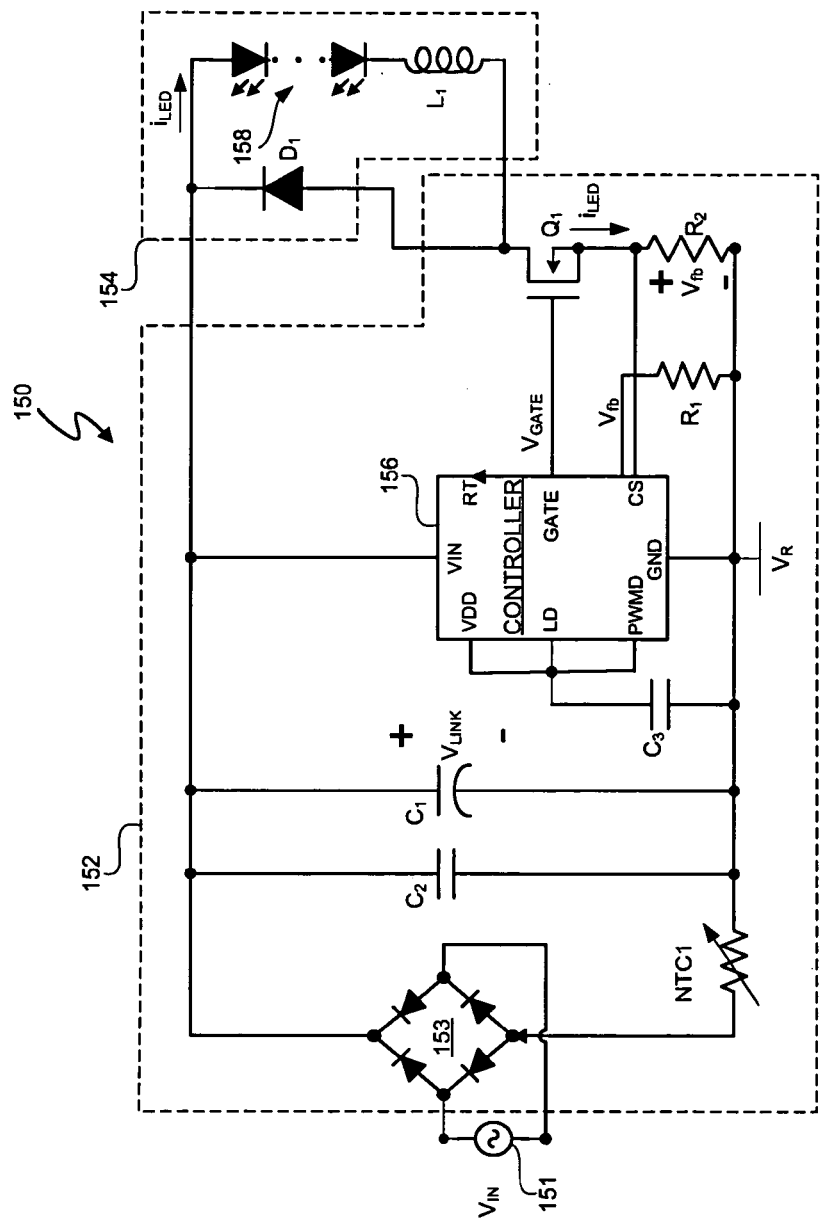
FIG. 1B (labeled prior art) depicts a switching light emitting diode (LED) driver system with LED current feedback.

Electronic system 240 also includes a voltage source 246 to provide a supply voltage to switching power converter 248. In at least one embodiment, voltage source 246 is a public utility voltage source such as voltage supply 101 (FIG. 1). Switching power converter 248 can be any type of switching power converter that provides a controlled current $i_{CCT}$ to load 250. Switching power converter 248 can be any type of switching power converter, such as a boost-type, buck-type, or boost-buck type switching power converter. Load 250 can be any type of load, such as a light source that includes one or more LEDs.

Figure 2C:
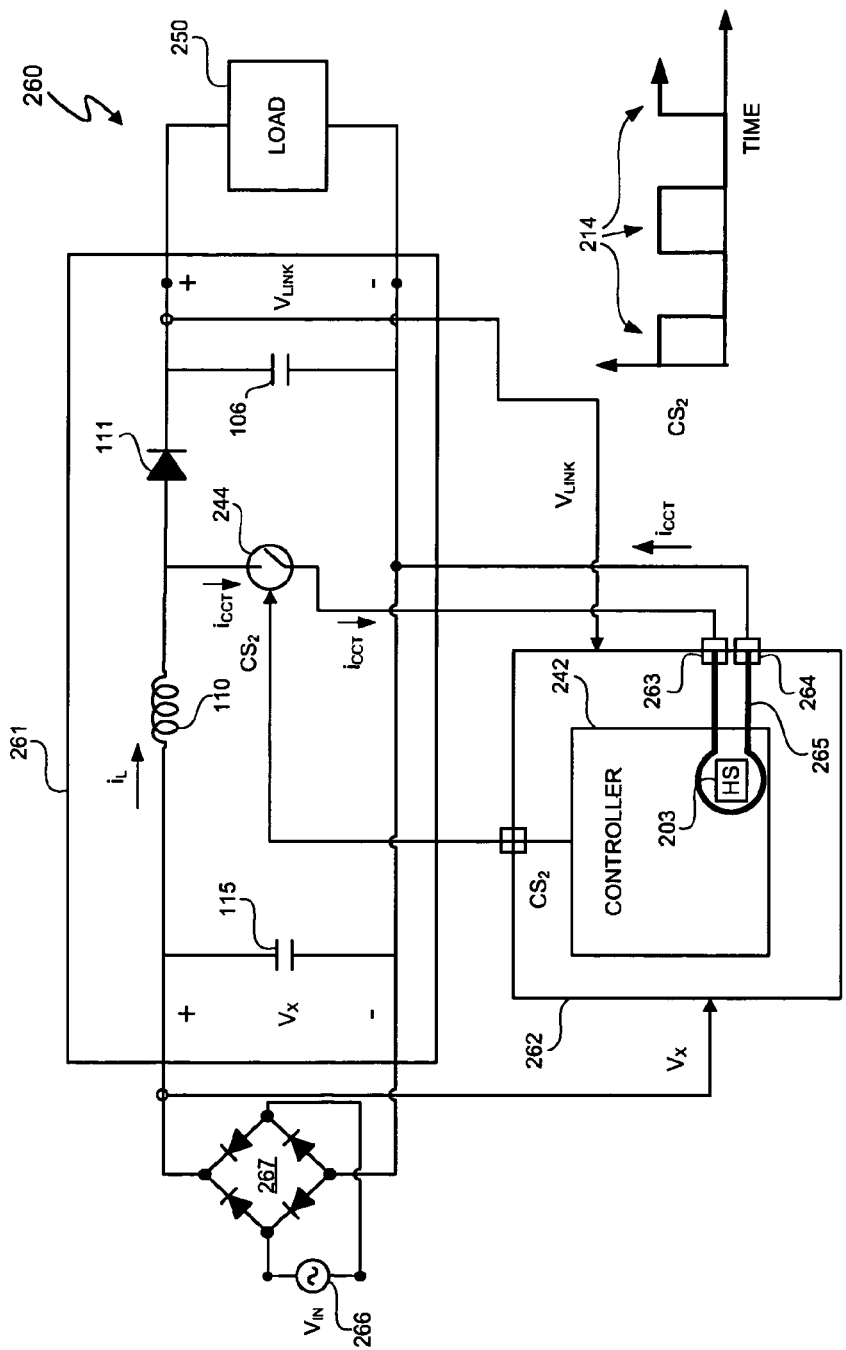

FIG. 2C depicts electronic system 260, which represents one embodiment of electronic system 240 (FIG. 2B). Electronic system 260 includes a switching power converter 261, which represents one embodiment of switching power converter 248 (FIG. 2B). Electronic system 260 includes a printed circuit board (PCB) 262, and controller 242 is attached to PCB 262. Pins 263 and 264 of PCB 262 couple Hall sensor 203 to switch 244. As subsequently described with reference to FIG. 6A, signal path 265 represents a printed circuit board trace routed within a close enough proximity to Hall sensor 203 to allow Hall sensor 203 to sense a magnetic field generated by controlled current $i_{CCT}$. In at least one embodiment, controller 242 operates switching power converter 260 in CCM. In at least one embodiment, voltage source 266 is a public utility voltage source such as voltage supply 101 (FIG. 1), and full-bridge diode rectifier 267 rectifies the input voltage $V_{IN}$ to generate an AC, rectified voltage $V_X$. In at least one embodiment, using a sense signal from Hall sensor 203 indicating a value of controlled current $i_{CCT}$ and exemplary feedback signals $V_X$ and $V_{LINK}$ representing the rectified voltage $V_X$ and link voltage $V_{LINK}$, the controller 242 generates switch control signal $CS_2$ to control switch 244 and provide power factor correction for switching power converter 261. In at least one embodiment, switch control signal $CS_2$ also controls power factor correction and regulates link voltage $V_{LINK}$ in accordance with any conventional methodology and conventional controller, such as the CCM PFC controller, model number UCC28019A, available from Texas Instruments, Inc., Texas, USA.

Figure 2D:
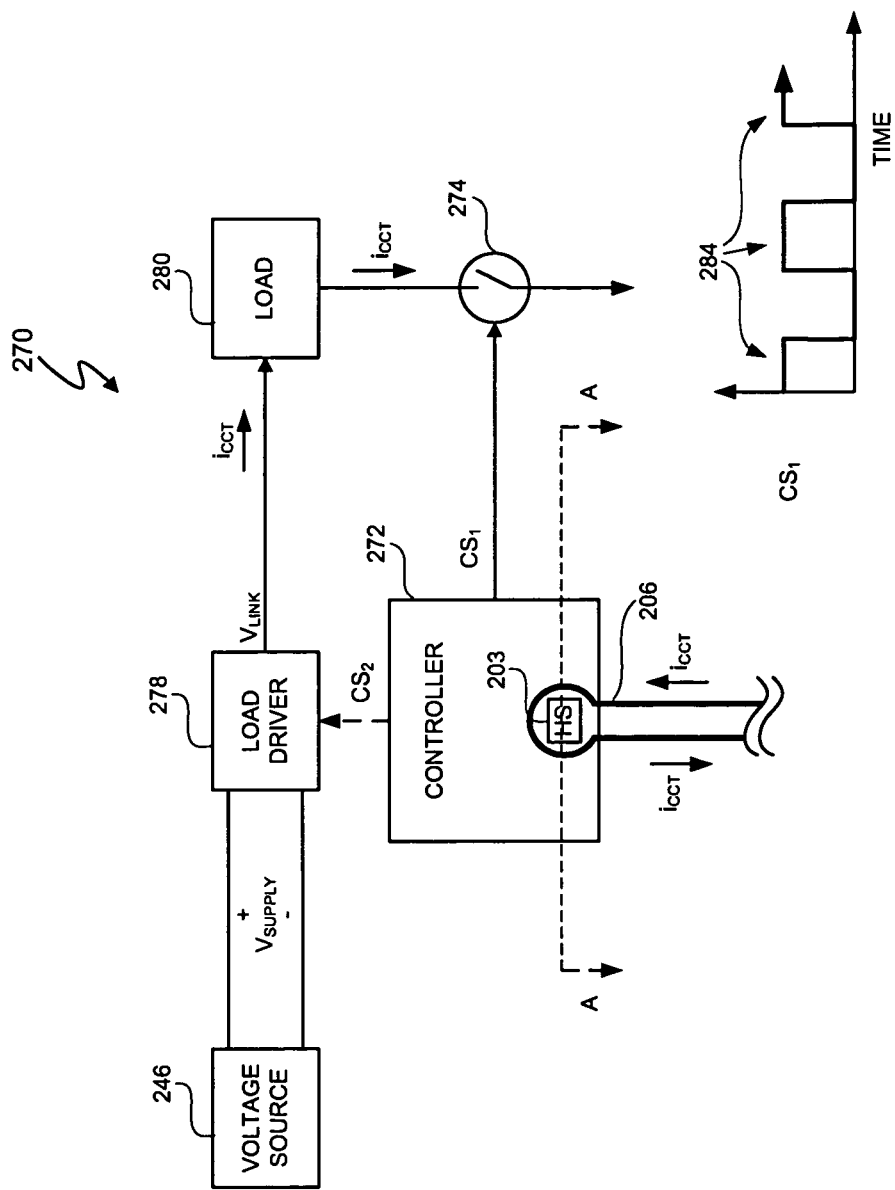

FIG. 2D depicts an electronic system 270 that includes a controller 272, and controller 272 generates a switch control signal $CS_1$ to control conductivity of switch 274. As subsequently described in more detail, controller 272 includes a Hall sensor 203 to sense controlled current $i_{CCT}$ from load 280. The controlled current $i_{CCT}$ is routed via signal path 206. The signal path 206 is within sufficient proximity to Hall sensor 203 to allow the Hall sensor 203 to develop a voltage corresponding to a magnetic field generated by the controlled current $i_{CCT}$. The connection and routing of signal path 206 to conduct the controlled current $i_{CCT}$ is a matter of design choice. Exemplary connection embodiments are described subsequently. As previously described, controller 272 utilizes the voltage developed by Hall sensor 203 as feedback corresponding to the controlled current $i_{CCT}$ to generate switch control signal $CS_2$ to control controlled current $i_{CCT}$.

Load driver 278 can be any type of load driver that provides a controlled current $i_{CCT}$ to load 280. In at least one embodiment, load driver 278 is a switching power converter, such as switching power converter 248, and controller 272 also generates a switch control signal $CS_2$ to control switch 244 as described with reference to FIG. 2B. Load 210 can be, for example, any type of load utilizing a controlled current $i_{CCT}$. In at least one embodiment, load 280 includes one or more light emitting diodes (LEDs).

Controller 272 generates control signal $CS_1$ to control conductivity of a current control switch 274. Switch 274 can be any type of switch that can be controlled by a switch control signal. In at least one embodiment, switch 274 is a field effect transistor (FET), and switch control signal $CS_2$ is a duty cycle modulated signal. In at least one embodiment, each pulse 284 of control signal $CS_2$ causes switch 274 to conduct. When each pulse ends, switch 274 is nonconductive. Thus, the duty cycle of control signal $CS_2$ controls an average value of controlled current $i_{CCT}$. The generation of control signal $CS_2$ is a matter of design choice. In at least one embodiment, controller 272 generates switch control signal $CS_2$ in the manner of generating a switch control signal illustratively described in U.S. patent application Ser. No. 11/864,366, entitled "Time-Based Control of a System having Integration Response," inventor John L. Melanson, and filed on Sep. 28, 2007 (referred to herein as "Melanson I"). In at least one embodiment, controller 272 generates switch control signal $CS_2$ in the manner of generating a switch control signal illustratively described in U.S. patent application Ser. No. 12/415,830, entitled "Primary-Side Based Control Of Secondary-Side Current For An Isolation Transformer," inventor John L. Melanson, and filed on Mar. 31, 2009 (referred to herein as "Melanson II"). Melanson I and II are incorporated by reference in their entireties.

As similarly described with reference to electronic system 200 (FIG. 2A), in at least one embodiment, the frequency $f_{iCCT}$ of switch control signal $CS_1$, and, thus, the frequency of each pulse of controlled current $i_{CCT}$, exceeds the frequency $f_N$ of the noise voltage of Hall sensor 203 by an amount sufficient to allow controllers 242, 262, and 272 to each effectively cancel out the noise voltage and determine a value of controlled current $i_{CCT}$. For example, in at least one embodiment, each of controllers 242, 262, and 272 determines the voltage $V_{ICCT}$ corresponding to the magnetic field of the controlled current $i_{CCT}$ by subtracting a sensed baseline noise voltage $V_{HB}$ of Hall sensor 203 from a sensed voltage Hall sensor output voltage $V_H$ representing the voltage corresponding to the magnetic field $V_{iCCT}$ of the controlled current $i_{CCT}$ plus the baseline noise voltage $V_{HB}$ of Hall sensor 203. Since the controlled current $i_{CCT}$ corresponds to the voltage corresponding to the magnetic field of the controlled current $i_{CCT}$, each of controllers 242, 262, and 272 can determine a value of the controlled current $i_{CCT}$.

Figure 3:
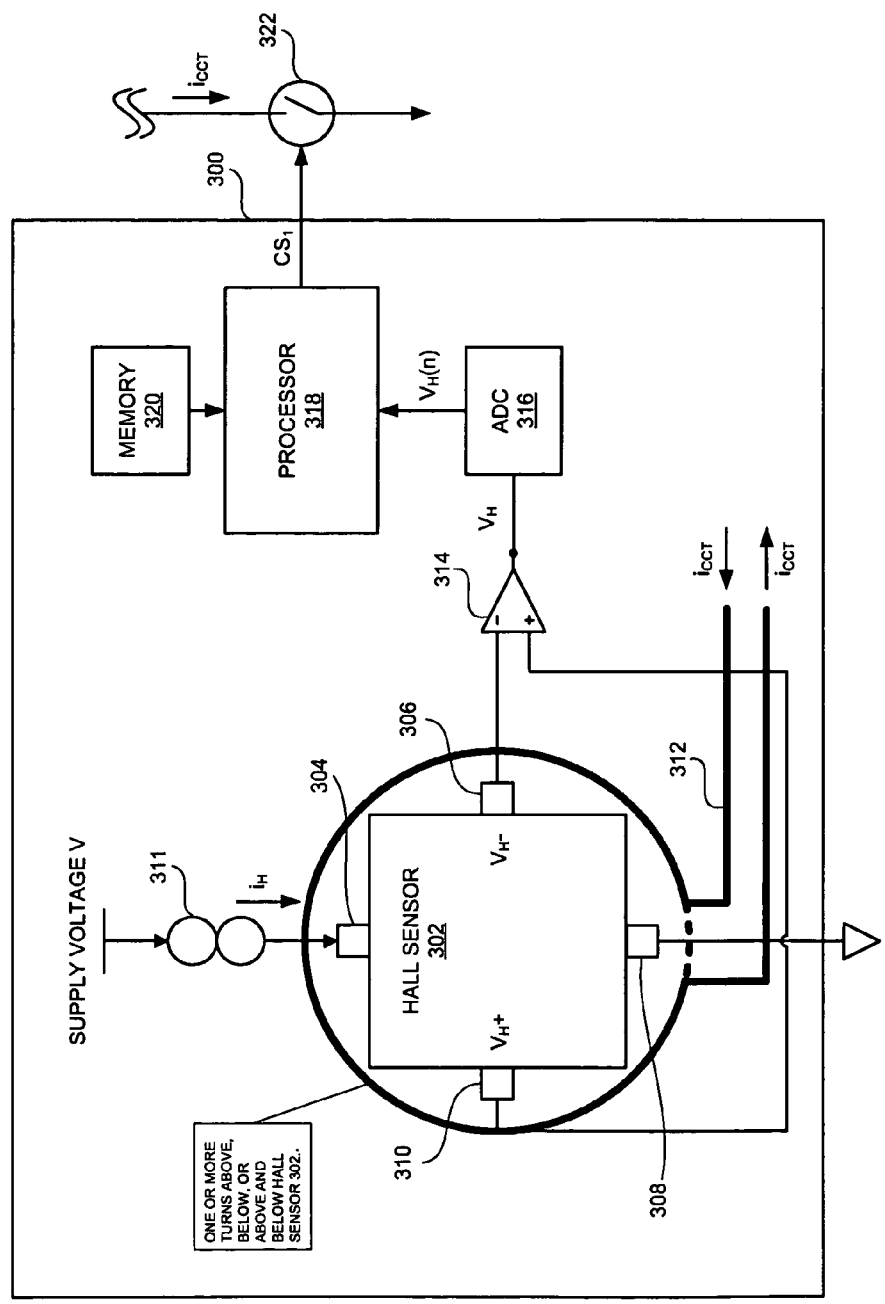
FIG. 3 depicts an embodiment of the controller for FIGS. 2A, 2B, 2C, and 2D.
Figure 4:
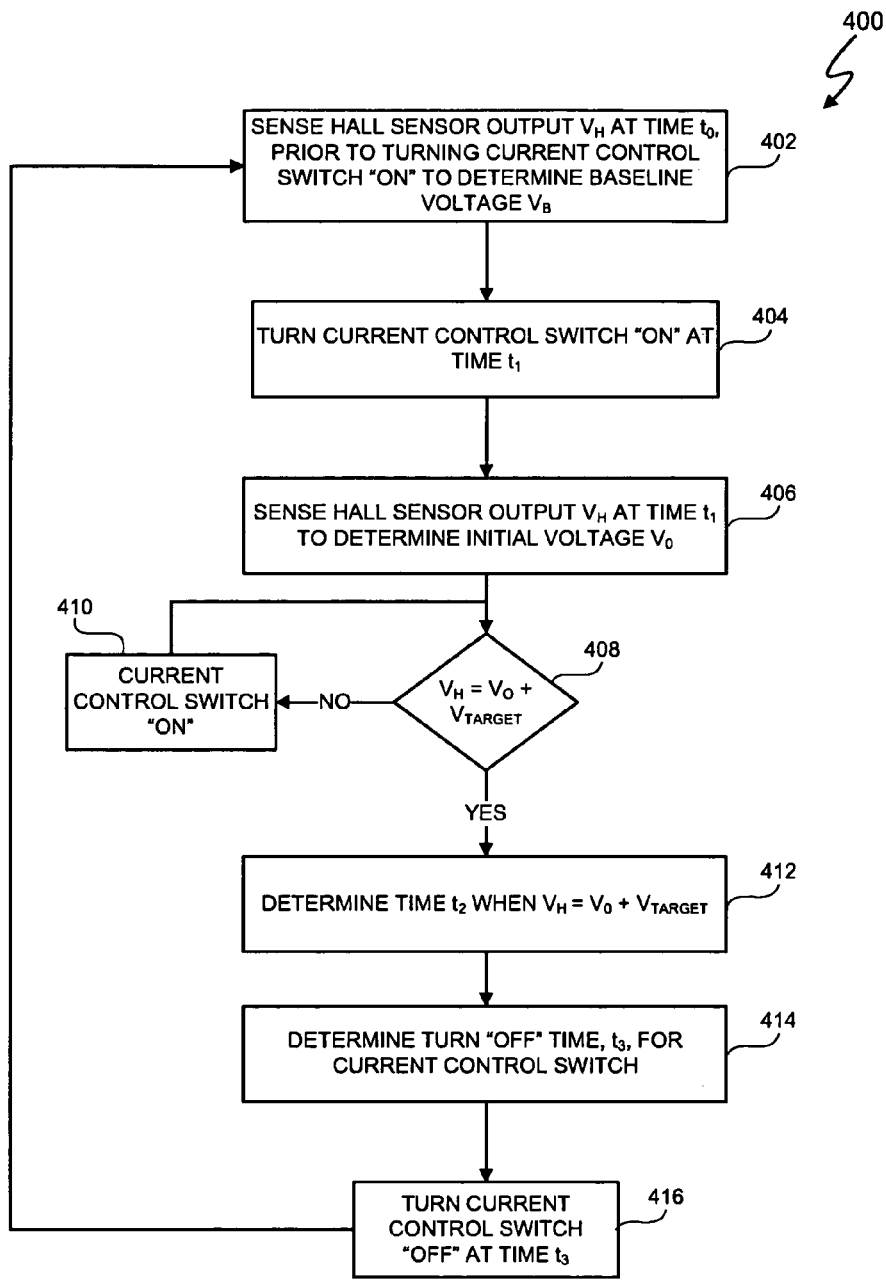
FIG. 4 depicts a flowchart showing an exemplary controlled current detection and switch control algorithm.
Figure 5:
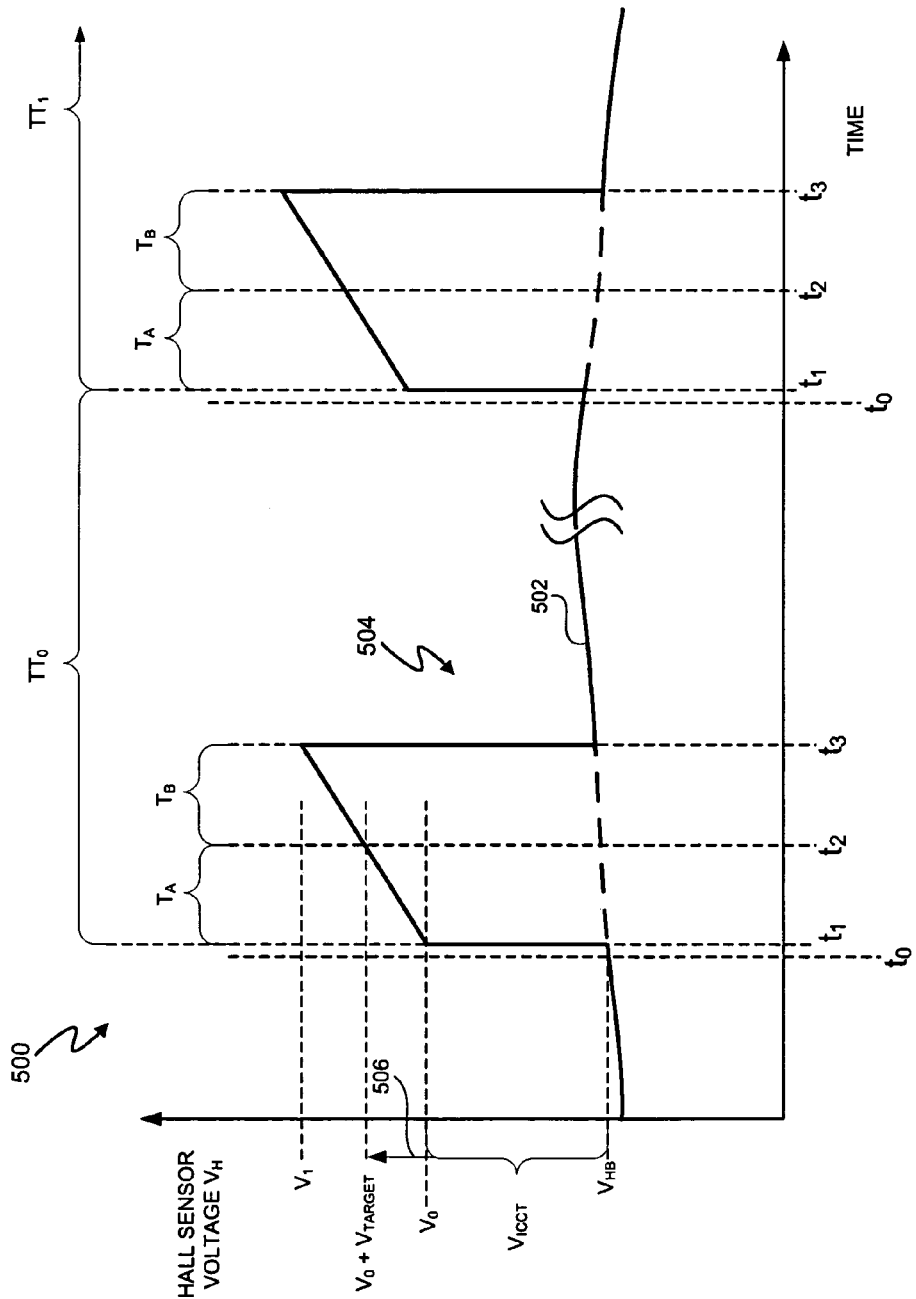
FIG. 5 depicts an exemplary Hall sensor voltage graph.

FIG. 3 depicts controller 300, which represents an exemplary embodiment of controllers 202, 242, and 272. FIG. 4 depicts a flowchart showing an exemplary controlled current detection and switch control algorithm 400 utilized by controller 300 to determine a value associated with a controlled current and to use the value as feedback to generate a switch control signal to control the controlled current. FIG. 5 depicts an exemplary Hall sensor voltage graph 500 to illustrate how the controller effectively cancels out the Hall sensor baseline noise voltage $V_{HB}$.

Figure 6A:
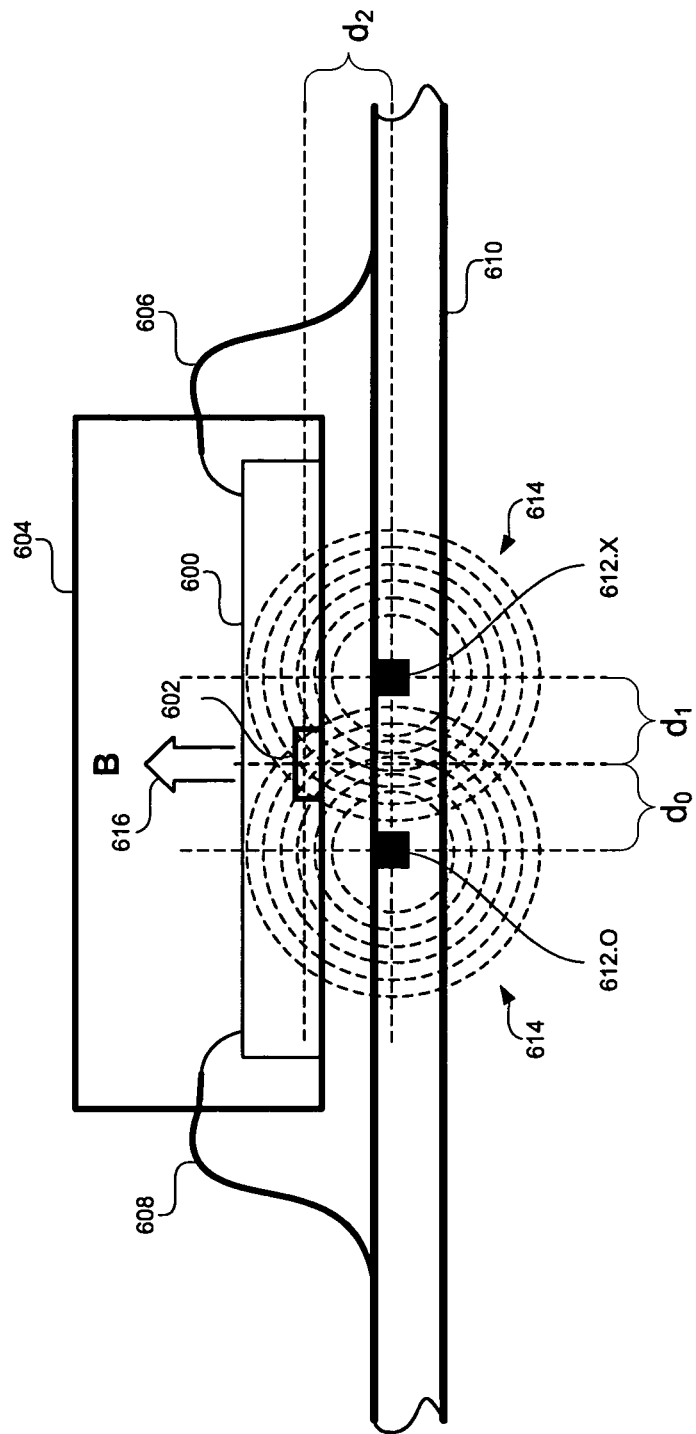
FIGS. 6A and 6B depict exemplary integrated circuit controllers that include Hall sensors.

Because the Hall sensor 203 functions based upon a magnetic field of controlled current $i_{CCT}$, the discussion no references FIG. 6A, which illustrates an exemplary placement of signal path 206 and a resulting magnetic field of the controlled current $i_{CCT}$. Referring to FIG. 6A, FIG. 6A depicts an exemplary integrated circuit controller 600 that includes a Hall sensor 602. Controller 600 represents one embodiment of controllers 202, 242, 272, and 300 fabricated as an integrated circuit and located within an integrated circuit package 604. The particular dimensions of controller 600 and Hall sensor 602 are a matter of design choice. The integrated circuit package 604 represents a cross-section of controller 202 along cross-sectional line A-A and includes exemplary leads 606 and 608. The integrated circuit leads 606 and 608 connect controller 600 to a printed circuit board 610. Signal path 612 represents an exemplary cross section of signal paths 206, 265, and 312. Signal path 612 is a signal trace in printed circuit board 610. ".X" and ".O" are appended to identifiers 612 to respectively indicate entry and exit points of controlled current $i_{CCT}$ in the cross-section of signal path 612. When controlled current $i_{CCT}$ is flowing as indicated, controlled current $i_{CCT}$ generates a magnetic field B indicated by the concentric, dashed circles 614. At the Hall sensor 602, the direction of the magnetic field B is generally "up" as indicated by arrow 616. Dimension $d_0$ represents a distance between the longitudinal centers of signal path 612.O and Hall sensor 602. Dimension $d_1$ represents a distance between longitudinal centers of signal path 612.X and Hall sensor 602. Dimension $d_2$ represents a distance between latitudinal centers of signal path 612 and Hall sensor 602. The particular values for dimensions $d_0$, $d_1$, and $d_2$ are a matter of design choice. In at least one embodiment, $d_0 = d_1 = d_2 = 1$ mm. In at least one embodiment, $d_0 = d_1 = d_2$ range from approximately 1 mm to several millimeters, such as 5 mm.

An exemplary operation of controller 300 is described with reference to FIGS. 3, 4, 5, and 6A. In at least one embodiment, the exemplary operation relates to controller 300 controlling switch 322 to control power factor correction in a switching power converter, such as switching power converter 248, operating in continuous conduction mode. In at least one embodiment, the exemplary operation relates to controller 300 controlling switch 322 to control the controlled current $i_{CCT}$ in a load, such as load 280.

Hall sensor 302 is an example of a Hall effect device. The particular design of Hall sensor 302 is a matter of design choice. Hall sensor 302 is, for example, fabricated from conductive material in a layer as part of an integrated circuit version of controller 300. In some embodiments, Hall sensor 302 is a silicon diffusion layer, a doped silicon layer, or polysilicon. Hall sensor 302 has four connection tabs 304, 306, 308, and 310. Tab 304 is connected to a constant current source 311, and tab 308 is connected to a reference, such as ground. Constant current source 311 supplies a current $i_H$ that flows through Hall sensor 302. As controlled current $i_{CCT}$ flows through signal path 612, a magnetic field B develops through the Hall sensor 302 as illustratively discussed in conjunction with FIG. 6A. The magnetic field B causes a separation of charge in Hall sensor 302. The separation of charge causes a voltage $V_H+$ to develop at tap 310 and a voltage $V_H-$ to develop at tab 306. Differential amplifier 314 amplifies the difference voltage $V_H+-V_H-$ to generate Hall sensor output voltage $V_H$. Thus, the Hall sensor output voltage $V_H$ equals $V_H+-V_H-$. The sensed Hall sensor output voltage $V_H$ is a function of the controlled current $i_{CCT}$. The particular relationship between controlled current $i_{CCT}$ and Hall sensor output voltage $V_H$ is a function of various factors such as the material from which Hall sensor 203 is fabricated, the routing and configuration of magnetic field B, and so on. The particular function can be determined by a one of ordinary skill in the art using well-known techniques.

In at least one embodiment, signal path 612 has one turn as depicted in cross-section in FIG. 6A. However, signal path 612 can have any number of turns and any orientation. The number of turns and orientation of the turns is a matter of design choice. In at least one embodiment, signal path 612 includes multiple turns in different layers of PCB 610 to increase the strength of the magnetic field B of controlled current $i_{CCT}$ sensed by Hall sensor 302. Additionally, signal path 312 can be routed through one or more layers of the controller 600. In another embodiment, magnetic material is used with the signal path 612 to direct the magnetic field.

Figure 6B:
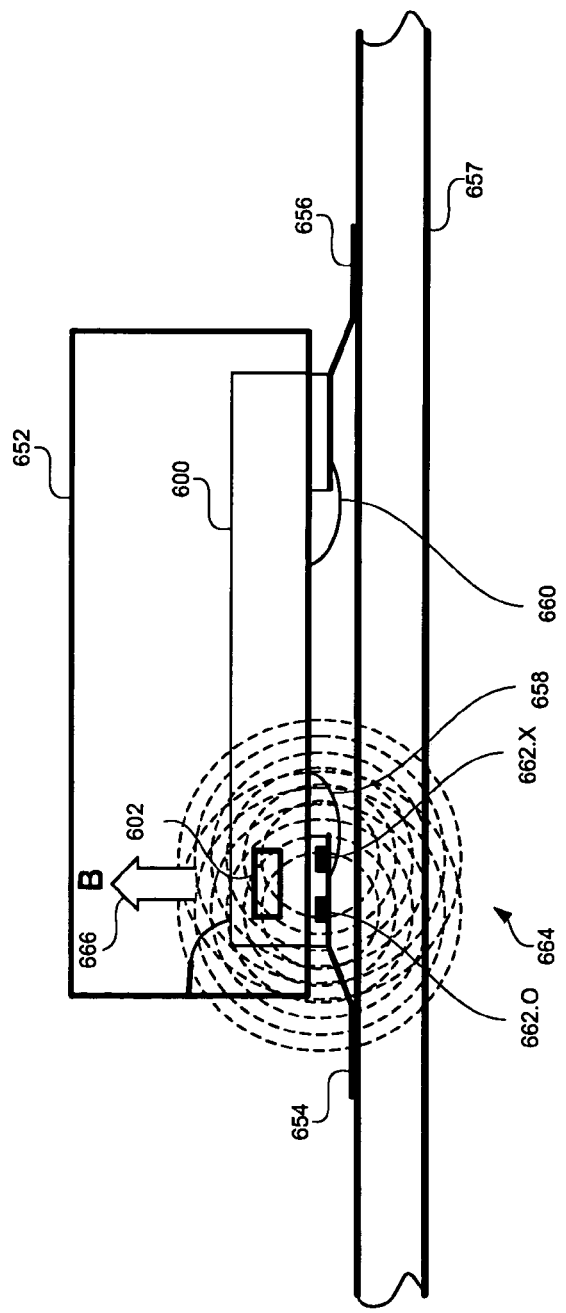

Routing of the signal path conducting controlled current $i_{CCT}$ is a matter of design choice. The signal path 612 FIG. 6B depicts another routing configuration for controlled current $i_{CCT}$ in an integrated circuit package 652 housing controller 600. The integrated circuit package 652 also represents a cross-section of controller 202 (FIG. 2) along cross-sectional line A-A and includes exemplary leads 654 and 656. Wires 658 and 660 connect controller 600 to respective leads 654 and 656. Leads 654 and 656 are part of a lead frame of integrated circuit package 652 that attach integrated circuit 652 to PCB 657. Signal path 662 represents an exemplary cross section of signal paths 206, 265, and 312. Signal path 662 is a signal trace located on top of lead 654. ".X" and ".O" are appended to identifiers 662 to respectively indicate entry and exit points of controlled current $i_{CCT}$ in the cross-section of signal path 662. When controlled current $i_{CCT}$ is flowing as indicated, controlled current $i_{CCT}$ generates a magnetic field B indicated by the concentric, dashed circles 664. At the Hall sensor 602, the direction of the magnetic field B is generally "up" as indicated by arrow 666. The Hall sensor 602 generates a voltage proportional to the magnetic field of the controlled current $i_{CCT}$ in signal path 662.

Referring to FIGS. 3, 4, and 5, Hall sensor 302 produces a low frequency noise voltage 502. The noise voltage 502 is shown as a dotted line during a pulse of controlled current $i_{CCT}$, which occurs during time periods $T_A$ and $T_B$. The actual Hall sensor output voltage $V_H$ is the solid line 504, which includes the noise voltage 502 and the noise voltage 502 and the voltage $V_{ICCT}$ corresponding to the controlled current $i_{CCT}$. Analog-to-digital converter (ADC) 316 converts the Hall sensor output voltage $V_H$ into a digital value $V_H(n)$. In at least one embodiment, processor 318 is digital signal processor or a mixed analog and digital signal processor. In at least one embodiment, the operations in controlled current detection and switch control algorithm 400 are stored as code in memory 320. The particular configuration and operation of processor 318 is a matter of design choice. In at least one embodiment, processor 318 retrieves the code from memory 320 and performs the operations of controlled current detection and switch control algorithm 400. In at least one embodiment, controlled current detection and switch control algorithm 400 is stored as firmware in a memory within processor 318. In at least one embodiment, controlled current detection and switch control algorithm 400 is stored in an off-chip memory that is accessible to processor 318. In at least one embodiment, processor 318 is configured as an analog device to perform operations in controlled current detection and switch control algorithm 400.

Referring now to FIG. 4, in operation 402, processor 318 senses the Hall sensor output voltage $V_H$ at time $t_0$ (i.e. prior to turning current control switch "on") to obtain a baseline Hall sensor noise voltage $V_{HB}$. Because the frequency $f_N$ of the Hall baseline noise voltage $V_{HB}$ is much larger than the frequency $f_{iCCT}$ of switch control signal $CS_1$, the Hall baseline voltage $V_{HB}$ remains relatively constant during time period $T_A$. Time $t_0$ corresponds to a time prior to generating switch control signal $CS_1$ to turn switch 322 "on", i.e. cause switch 322 to conduct. Switch 322 represents one embodiment of switches 204, 244, and 274.

In operation 404, processor 318 generates a pulse of control signal $CS_1$ at time $t_1$, which causes switch 322 to conduct and the controlled current $i_{CCT}$ to increase. The particular methodology for generating control signal $CS_1$ is a matter of design choice. In at least one embodiment, each period of control signal $CS_1$ is constant, as, for example, described in Melanson I and II ("periods" are described in terms of switch states in Melanson I).

The time lapse between times $t_0$ and $t_1$ is a matter of design choice. In at least one embodiment, the time lapse between times $t_1-t_0$ is minimized to establish a baseline noise voltage $V_{HB}$ that is approximately unchanged between times $t_0$ and $t_2$. In operation 406, processor 318 samples the Hall sensor output voltage $V_H$ at time $t_1$ to determine an initial voltage value $V_0$ of the Hall sensor voltage Hall sensor output voltage $V_H$. The initial value $V_0$ represents the Hall baseline noise voltage $V_{HB}$ plus the voltage $V_{ICCT}$ corresponding to the controlled current $i_{CCT}$ at the beginning of the pulse of switch control signal $CS_1$. The initial value of the controlled current $i_{CCT}$ at time $t_1$ is a function of $V_0-V_{HB}$, since $V_0=V_{HB}+V_{ICCT}$. As previously discussed, determination of the initial value of the controlled current $i_{CCT}$ from $V_0-V_{HB}$ is a well-known function based on the material make-up of the Hall sensor 203, the number of turns of signal path 206, and distances $d_0$, $d_1$, and $d_2$ (FIG. 6A), and so on.

As the controlled current $i_{CCT}$ increases, the strength of the magnetic field B increases, and, thus, the voltage $V_{ICCT}$ component of the Hall sensor output voltage $V_H$ also increases as shown by arrow 506. However, since the noise frequency $f_N$ of Hall sensor 304 is much less than the frequency $f_{iCCT}$ of the switch control signal $CS_1$, the baseline noise voltage $V_{HB}$ remains relatively constant during period $T_A$. Processor 318 continues to sample the Hall sensor output voltage $V_H$ to determine when the Hall sensor output voltage $V_H$ has increased from the initial voltage $V_0$ to the target voltage $V_{TARGET}$. The particular sampling frequency of the Hall sensor output voltage $V_H$ is a matter of design choice. In at least one embodiment, the sampling frequency is high enough to determine approximately when the Hall sensor output voltage $V_H$ has increased from the initial voltage $V_0$ to the target voltage $V_{TARGET}$.

Operation 408 determines whether the Hall sensor output voltage $V_H$ has increased from the initial voltage $V_0$ by a target voltage $V_{TARGET}$. In at least one embodiment, the target voltage $V_{TARGET}$ is directly related to the controlled current $i_{CCT}$. The particular target voltage $V_{TARGET}$ depends on, for example, a desired average controlled current. For example, in at least one embodiment, the initial voltage $V_0$ represents 350 mA, the target voltage $V_{TARGET}$ represents 50 mA, and the peak voltage $V_1$ represents 400 mA, so that the average controlled current equals 400 mA.

In at least one embodiment, to determine if the Hall sensor output voltage $V_H$ equals the initial voltage $V_0+V_{TARGET}$, between times $t_1$ and $t_2$ operation 408 subtracts the initial voltage $V_0$ from a sampled Hall sensor output voltage $V_H$ to determine if the sampled Hall sensor output voltage $V_H$ has increased from the initial voltage $V_0$ by an amount equal to the target voltage $V_{TARGET}$. The frequency $f_{iCCT}$ of switch control signal $CS_1$ is large relative to the frequency $f_N$ of Hall voltage noise 502. For example, in at least one embodiment, the frequency of switch control signal $CS_1$ is approximately 100 kHz, and the frequency of the Hall voltage noise 502 is approximately 100 Hz. So, the Hall voltage noise 502 remains approximately constant between times $t_1$ and $t_3$. Thus, subtracting the initial sampled Hall sensor voltage $V_0$ corresponding to the leading edge of switch control signal $CS_1$ at time $t_1$ from the current sample of Hall sensor output voltage $V_H$ represents the change $V_A$ in the voltage $V_{ICCT}$ corresponding to the controlled current $i_{CCT}$, i.e. $V_H=V_0+V_A$.

If the Hall sensor output voltage $V_H$ does not equal the initial voltage $V_0+V_{TARGET}$, in operation 410, processor 318 continues generating a pulse of switch control signal $CS_1$ to keep switch 322 "on". Thus, the controlled current $i_{CCT}$ continues to increase causing the Hall sensor output voltage $V_H$ to increase. Operation 410 returns to operation 408, and processor 318 continues to sense the Hall sensor output voltage $V_H$. If in operation 408 processor 318 determines that $V_A=V_{TARGET}$, operation 412 determines the time $t_2$ at which $V_A=V_{TARGET}$.

In operation 414, processor 318 determines the time $t_3$ at which to cease generating the pulse of control signal $CS_1$ and, thus, turn switch 322 "off". In at least one embodiment, the switch 322 turn "off" time $t_3$ is set so that times $t_3-t_2=t_2-t_1$. Time period $T_A$ equals times $t_2-t_1$, and time period $T_B$ equals times $t_3-t_2$. Thus, in at least one embodiment, processor 318 sets the time period $T_A$ during which the Hall sensor output voltage $V_H$ rises from the baseline voltage $V_0$ to the target voltage $V_{TARGET}V_0$ to be the same or approximately the same as the time period $T_B$ during which the Hall sensor output voltage $V_H$ rises from the target voltage $V_{TARGET}+V_0$ to a peak voltage $V_1$.

In operation 416, processor 318 ends the pulse of control signal $Cs_1$, thus, turning switch 322 "off". When switch 322 is "off", the controlled current $i_{CCT}$ continues to decrease. Operation 402 restarts controlled current detection and switch control algorithm 400 at the beginning of period $TT_1$ for control signal $_{CS1}$ and continues for each consecutive period.

Figure 7:
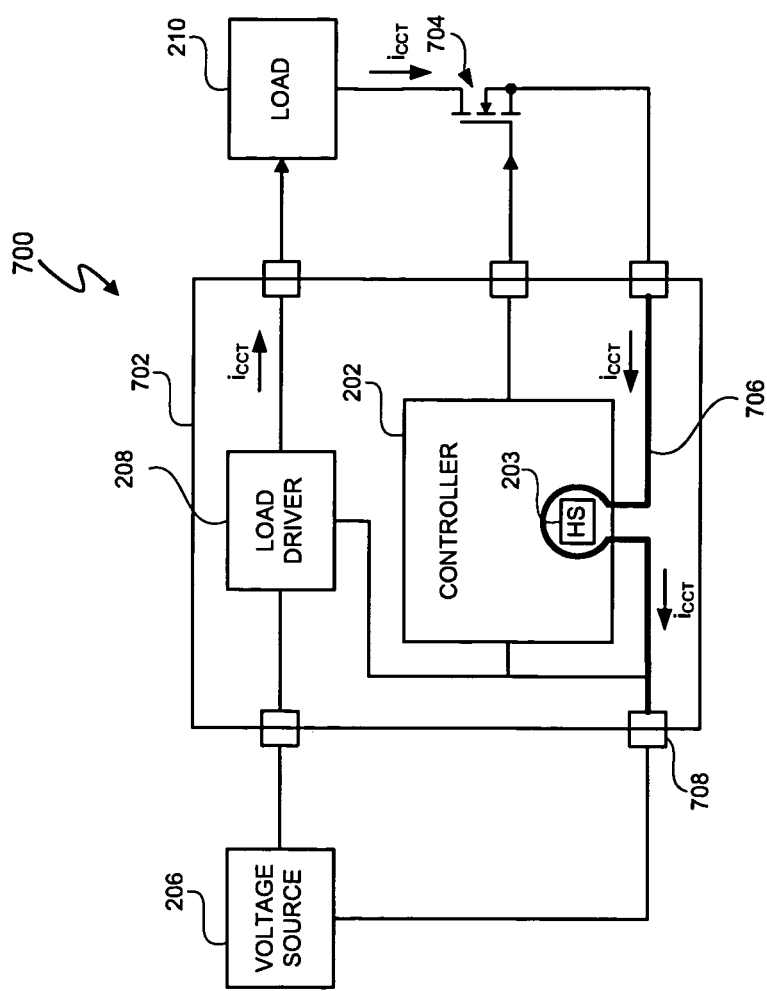
FIG. 7 depicts an embodiment of the electronic system of FIG. 2.
Figure 8:
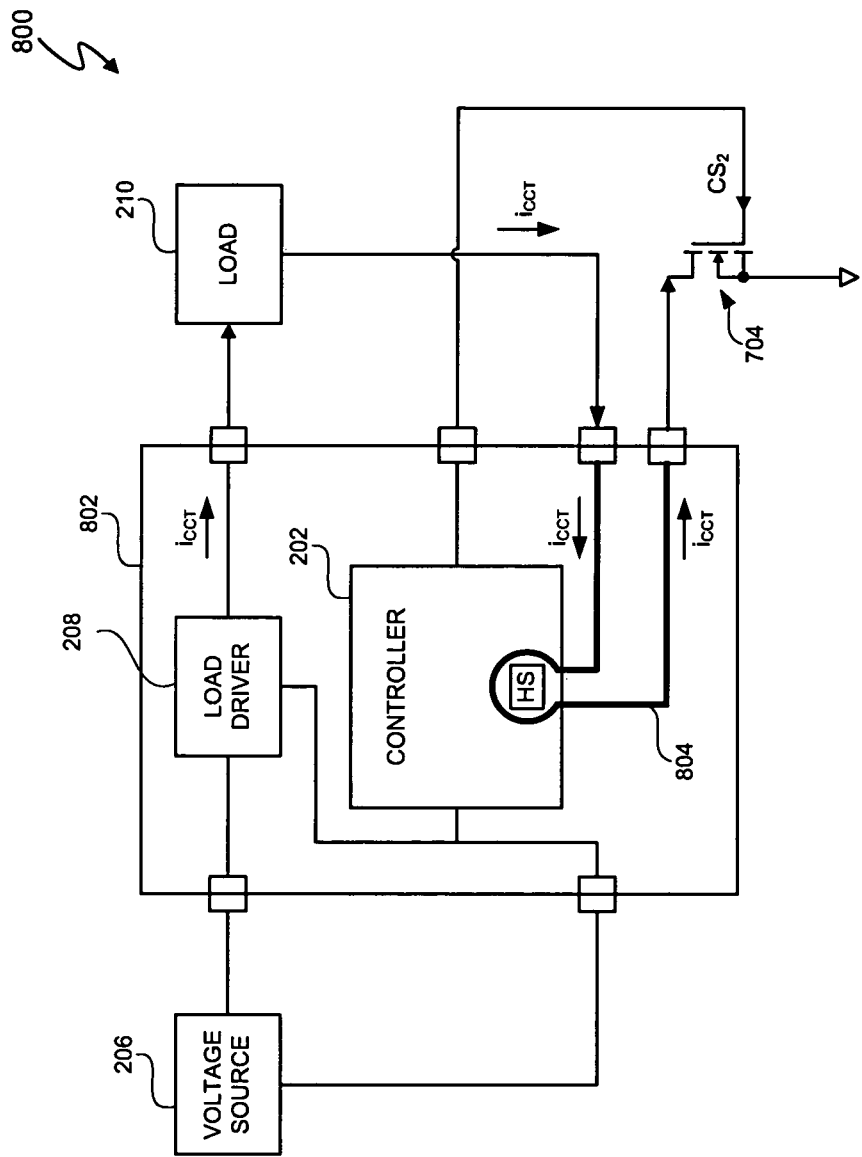
FIG. 8 depicts another embodiment of the electronic system of FIG. 2.

As previously discussed, the connection and routing of signal paths 206, 265, and 312, which conduct embodiments of the controlled current $i_{CCT}$, are a matter of design choice. FIGS. 7 and 8 depict respective, exemplary embodiments of electronic system 200 and routing of signal paths to conduct controlled current $i_{CCT}$ into a proximal relationship with Hall sensor 203, thus, allowing Hall sensor 203 to generate a voltage in response to the magnetic field of the controlled current $i_{CCT}$.

Referring to FIG. 7, electronic system 700 represents one embodiment of electronic system 200. In electronic system 700, load driver 208 and controller 202 are attached to a printed circuit board 702. N-channel metal oxide semiconductor field effect transistor (MOSFET) 704 represents an embodiment of switch 212. Signal trace 706 represents an embodiment of signal trace 206. Signal trace 706 is in series with a source of MOSFET 704 and a reference voltage connection 708 to allow Hall sensor 203 to sense the magnetic field of the controlled current $i_{CCT}$ in signal trace 706.

Referring to FIG. 8, electronic system 800 represents one embodiment of electronic system 200. In electronic system 800, load driver 208 and controller 202 are attached to a printed circuit board 802. Signal trace 804 represents an embodiment of signal trace 206. Signal trace 804 is in series with a drain of MOSFET 704 to allow Hall sensor 203 to sense the magnetic field of the controlled current $i_{CCT}$ in signal trace 704.

The routings, connections, and configurations of a signal path to allow Hall sensor 203 to sense the magnetic field generated by the controlled current $i_{CCT}$ are virtually limitless and are a matter of design choice.

Figure 9:
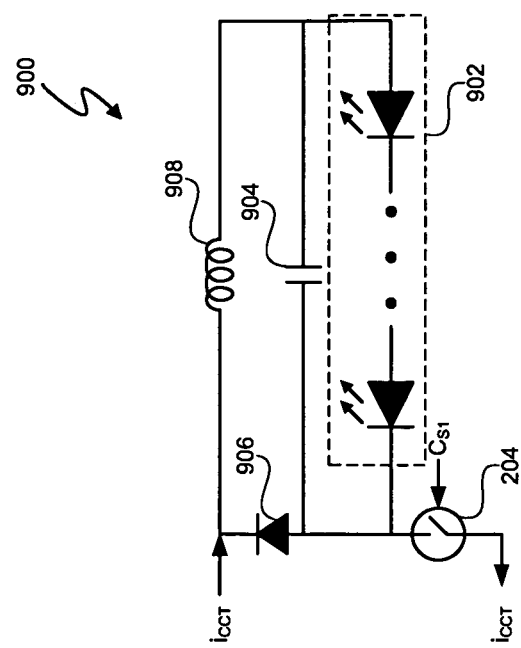
FIG. 9 depicts a light source.

FIG. 9 depicts a light source 900, which represents one embodiment of load 210. Light source 900 includes one or more LEDs 902 and exemplary peripheral circuitry including a capacitor 904 connected across the LEDs 902, and series connected diode 906 and inductor 908 connected in parallel with capacitor 904 and LEDs 902.

Thus, an electronic system includes a Hall sensor to sense a controlled current, and a controller receives information either directly or indirectly from the Hall sensor corresponding to the controlled current and utilizes the information from the Hall sensor to control conductivity of a switch. In at least one embodiment, controlling conductivity of the switch controls a drive current for a load. In at least one embodiment, utilizing the Hall sensor to detect the controlled current $i_{CCT}$ is more accurate than using a sense resistor (such as sense resistor 109 (FIG. 1)) and dissipates less power than using the sense resistor.

Although the present invention has been described in detail, it should be understood that various changes, substitutions and alterations can be made hereto without departing from the spirit and scope of the invention as defined by the appended claims. For example, in at least one embodiment, the controlled current sensed by the Hall sensor 203 is representative of an actual controlled current $i_{CCT}$ but is not the current flowing through the load. For example, in at least one embodiment, a current mirror can be used to mirror the controlled current $i_{CCT}$ and the controlled current sensed by the Hall sensor 203 is the mirrored current.

What is claimed is:

1. An apparatus comprising:
   an integrated circuit comprising:
      a Hall sensor configured to sense a magnetic field of a controlled current; and
      a controller coupled to the Hall sensor, wherein at least during operation the controller is configured to: (i) receive information from the Hall sensor, (ii) sample the information at a sample frequency sufficiently greater than a frequency of Hall sensor noise voltage to effectively cancel out the Hall sensor noise voltage from the information received from the Hall sensor, and (ii) use the information to determine a time to cause a switch, which controls the controlled current, to conduct.

2. The apparatus of claim 1 wherein the controller is configured to:
   sense a voltage $V_0$ from the Hall sensor while the switch is nonconductive ("off");
   generate a switch control signal at time $t_1$ to cause the switch to conduct ("on") and the controlled current to flow;
   sense a voltage $V_1$ from the Hall sensor while the switch is conductive; and
   determine a time $t_3$ to turn the switch "off" based on a time $t_2$, wherein time $t_2$ is when the sensed voltage $V_1$ plus the sensed voltage $V_0$ equals a target voltage; and
   generate the switch control signal at time $t_3$ to turn the switch "off".

3. The apparatus of claim 2 wherein the times $t_2-t_1=t_3-t_2$.

4. The apparatus of claim 1 further comprising:
   a signal trace located within proximity of the Hall sensor to allow the Hall sensor to sense the magnetic field of the controlled current.

5. The apparatus of claim 4 wherein the signal trace is included in a printed circuit board coupled to the integrated circuit.

6. The apparatus of claim 4 further comprising:
   an integrated circuit package containing the integrated circuit, wherein the integrated circuit includes a lead frame, wherein the signal trace is attached to the lead frame.

7. The apparatus of claim 1 further comprising:
a circuit board coupled to the integrated circuit; and
the switch coupled to the circuit board via a signal trace, wherein the signal trace is configured to conduct the controlled current in proximity to the Hall sensor to allow the Hall sensor to sense the controlled current.

8. The apparatus of claim 7 wherein the switch comprises a field effect transistor and the signal trace is coupled in series with the switch.

9. The apparatus of claim 1 further comprising an analog-to-digital converter to convert the information received from the Hall sensor into a digital signal, wherein the information comprises the digital signal, and the digital signal represents a first voltage at a first time that includes a component associated with the controlled current and a component associated with Hall sensor noise and the digital signal represents a second voltage at a second time that includes the component associated with the Hall sensor noise and does not include the component associated with the controlled current, and the controller is further configured to determine a difference between the first voltage and the second voltage to determine a third voltage that corresponds to a value of the controlled current.

10. The apparatus of claim 9 wherein the component of the first voltage associated with the controlled current is directly proportional to a drive current for the load.

11. The apparatus of claim 1 wherein the apparatus further comprises a load, the load comprises at least one light emitting diode.

12. The apparatus of claim 1 wherein the information comprises an analog signal representing a first voltage at a first time that includes a component associated with the controlled current and a component associated with Hall sensor noise and the signal represents a second voltage at a second time that includes the component associated with the Hall sensor noise and does not include the component associated with the controlled current, and the controller is further configured to determine a difference between the first voltage and the second voltage to determine a third voltage that corresponds to a value of the controlled current.

13. The apparatus of claim 1 wherein the controller is configured to control the switch to control current in a load.

14. The apparatus of claim 1 wherein the switch is included in a switching power converter and the controller is configured to control the switch to provide power factor correction for the switching power converter.

15. The apparatus of claim 14 further comprising:
the switching power converter coupled to the controller.

16. A method comprising:
in an integrated circuit:
sensing a magnetic field of a controlled current using a Hall sensor in the integrated circuit;
receiving information from the Hall sensor;
sampling the information received from the Hall sensor at a frequency sufficiently greater than a frequency of Hall sensor noise voltage to effectively cancel out the Hall sensor noise voltage from the information received from the Hall sensor; and
utilizing the information to determine a time to cause a switch, which controls the controlled current, to conduct.

17. The method of claim 16 further comprising:
sensing a voltage V0 from the Hall sensor while the switch is nonconductive ("off");
generating a switch control signal at time t1 to cause the switch to conduct ("on") and the controlled current to flow;
sensing a voltage V1 from the Hall sensor while the switch is conductive; and
determining a time t3 to turn the switch "off" based on a time t2, wherein time t2 is when the sensed voltage V1 plus the sensed voltage V0 equals a target voltage; and
generating the switch control signal at time t3 to turn the switch "off".

18. The method of claim 17 wherein the times $t_2-t_1=t_3-t_2$.

19. The method of claim 16 further comprising:
conducting the controlled current in a signal trace located within proximity of the Hall sensor to allow the Hall sensor to sense the magnetic field of the controlled current.

20. The method of claim 19 wherein the signal trace is included in a printed circuit board coupled to the integrated circuit.

21. The method of claim 19 wherein the signal trace is attached to a lead frame of an integrated circuit.

22. The method of claim 19 wherein the switch comprises a field effect transistor and the signal trace is coupled in series with the switch.

23. The method of claim 16 further comprising converting the information received from the Hall sensor into a digital signal, wherein the digital signal represents a first voltage at a first time that includes a component associated with the controlled current and a component associated with Hall sensor noise and the digital signal represents a second voltage at a second time that includes the component associated with the Hall sensor noise and does not include the component associated with the controlled current, and the method further comprises:
determine a difference between the first voltage and the second voltage to determine a third voltage that corresponds to a value of the controlled current.

24. The method of claim 23 wherein the component of the first voltage associated with the controlled current is directly proportional to a drive current for the load.

25. The method of claim 16 wherein the load comprises at least one light emitting diode.

26. The method of claim 16 wherein the information comprises an analog signal representing a first voltage at a first time that includes a component associated with the controlled current and a component associated with Hall sensor noise and the analog signal represents a second voltage at a second time that includes the component associated with the Hall sensor noise and does not include the component associated with the controlled current, and the method further comprises:
determine a difference between the first voltage and the second voltage to determine a third voltage that corresponds to a value of the controlled current.

27. The method of claim 16 wherein utilizing the information to determine a time to cause a switch to conduct further comprises:
controlling the switch to control power factor correction of a switching power converter.

28. The method of claim 16 further comprising:
conducting the controlled current in a signal trace located within proximity of the Hall sensor to allow the Hall sensor to sense the magnetic field of the controlled current, wherein the signal trace is included in a printed circuit board coupled to the integrated circuit.

29. The method of claim 28 wherein the signal trace is attached to a lead frame of an integrated circuit.

30. An apparatus comprising:
an integrated circuit that includes:
  means for sensing a magnetic field of a controlled current using a Hall sensor in the integrated circuit;
  means for receiving information from the Hall sensor;
  means for sampling the information received from the Hall sensor at a frequency sufficiently greater than a frequency of Hall sensor noise voltage to effectively cancel out the Hall sensor noise voltage from the information received from the Hall sensor; and
  means for utilizing the information to determine a time to cause a switch, which controls the controlled current, to conduct.

31. An apparatus comprising:
an integrated circuit comprising:
  a Hall sensor configured to sense a magnetic field of a controlled current; and
  a controller coupled to the Hall sensor, wherein the controller is configured to:
    sense a voltage $V_0$ from the Hall sensor while the switch is nonconductive ("off");
    generate a switch control signal at time $t_1$ to cause the switch to conduct ("on") and the controlled current to flow;
    sense a voltage $V_1$ from the Hall sensor while the switch is conductive; and
    determine a time $t_3$ to turn the switch "off" based on a time $t_2$, wherein time $t_2$ is when the sensed voltage $V_1$ plus the sensed voltage $V_0$ equals a target voltage; and
    generate the switch control signal at time $t_3$ to turn the switch "off".

32. The apparatus of claim 31 wherein the controller is further configured to effectively cancel out Hall sensor noise voltage from the information received from the Hall sensor to determine a time to cause the switch, which controls the controlled current, to conduct.

33. The apparatus of claim 32 wherein a frequency of the Hall sensor noise voltage is sufficiently less than a sample frequency of the information received from the Hall sensor to effectively cancel out Hall sensor noise voltage from the information received from the Hall sensor.

34. The apparatus of claim 31 wherein the times $t_2 - t_1 = t_3 - t_2$.

35. The apparatus of claim 31 further comprising:
a signal trace located within proximity of the Hall sensor to allow the Hall sensor to sense the magnetic field of the controlled current, wherein the signal trace is included in a printed circuit board coupled to the integrated circuit.

36. The apparatus of claim 35 further comprising:
an integrated circuit package containing the integrated circuit, wherein the integrated circuit includes a lead frame, wherein the signal trace is attached to the lead frame.

37. The apparatus of claim 31 wherein the apparatus further comprises a load, the load comprises at least one light emitting diode.

38. The apparatus of claim 31 wherein the switch is included in a switching power converter and the controller is configured to control the switch to provide power factor correction for the switching power converter.

39. A method comprising:
in an integrated circuit:
  sensing a magnetic field of a controlled current using a Hall sensor in the integrated circuit;
  sensing a voltage V0 from the Hall sensor while the switch is nonconductive ("off");
  generating a switch control signal at time t1 to cause the switch to conduct ("on") and the controlled current to flow;
  sensing a voltage V1 from the Hall sensor while the switch is conductive; and
  determining a time t3 to turn the switch "off" based on a time t2, wherein time t2 is when the sensed voltage V1 plus the sensed voltage V0 equals a target voltage; and
  generating the switch control signal at time t3 to turn the switch "off".

40. The method of claim 39 wherein utilizing the information to determine a time to cause a switch further comprises:
effectively cancelling out Hall sensor noise voltage received from the Hall sensor to determine a time to cause the switch, which controls the controlled current, to conduct.

41. The method of claim 40 further comprising:
sampling the voltages received from the Hall sensor at a frequency sufficiently greater than a frequency of the Hall sensor noise voltage to effectively cancel out the Hall sensor noise voltage received from the Hall sensor.

42. The method of claim 39 wherein the times $t_2 - t_1 = t_3 - t_2$.

43. The method of claim 39 wherein the load comprises at least one light emitting diode.

44. The method of claim 39 wherein utilizing the information to determine a time to cause a switch to conduct further comprises:
controlling the switch to control power factor correction of a switching power converter.

\* \* \* \* \*